United States Patent
Li et al.

(10) Patent No.: US 11,539,000 B2
(45) Date of Patent: Dec. 27, 2022

(54) COMPOUND, DISPLAY PANEL, AND DISPLAY DEVICE

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Yang Li, Shanghai (CN); Lei Zhang, Shanghai (CN); Jinghua Niu, Shanghai (CN); Wei Gao, Shanghai (CN); Wenpeng Dai, Shanghai (CN); Ying Liu, Shanghai (CN)

(73) Assignees: Wuhan Tianma Micro-Electronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 410 days.

(21) Appl. No.: 16/730,337

(22) Filed: Dec. 30, 2019

(65) Prior Publication Data

US 2021/0126201 A1   Apr. 29, 2021

(30) Foreign Application Priority Data

Oct. 29, 2019   (CN) .......................... 201911039517.0

(51) Int. Cl.
*H01L 51/00*   (2006.01)
*H01L 51/50*   (2006.01)

(52) U.S. Cl.
CPC ...... *H01L 51/0067* (2013.01); *H01L 51/0058* (2013.01); *H01L 51/0059* (2013.01);
(Continued)

(58) Field of Classification Search
None
See application file for complete search history.

(56) References Cited

U.S. PATENT DOCUMENTS

2012/0126209 A1*   5/2012   Kawamura ......... H01L 51/5096
                                                              257/40
2013/0306958 A1*  11/2013   Ito ........................ C07D 405/10
                                                              257/40
(Continued)

FOREIGN PATENT DOCUMENTS

CN        103221407 A        7/2013
CN        105884830 A        8/2016
WO        2015122711 A1      8/2015

OTHER PUBLICATIONS

Machine translation of WO-2015122711, translation generated Jul. 2022, 27 pages. (Year: 2022).*

*Primary Examiner* — Robert S Loewe
(74) *Attorney, Agent, or Firm* — Anova Law Group, PLLC

(57) ABSTRACT

The present disclosure provides a compound having a formula (I):

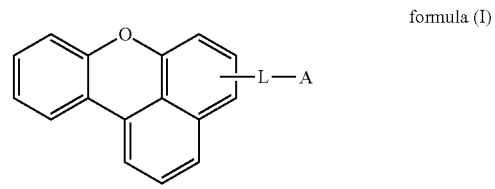

formula (I)

where A represents a nitrogen-containing heteroaromatic ring substituent; and L is one or more selected from a single bond, substituted or unsubstituted C1-C12 alkyl, substituted or unsubstituted C3-C8 cycloalkyl, substituted or unsubstituted C1-C8 alkoxy, substituted or unsubstituted C3-C8

(Continued)

heterocyclyl, substituted or unsubstituted C6-C40 aryl, and substituted or unsubstituted C4-C40 heteroaryl.

12 Claims, 1 Drawing Sheet

(52) U.S. Cl.
CPC ...... *H01L 51/0073* (2013.01); *H01L 51/5056* (2013.01); *H01L 51/5072* (2013.01)

(56) References Cited

U.S. PATENT DOCUMENTS

| | | | |
|---|---|---|---|
| 2015/0001479 A1 | 1/2015 | Lee et al. | |
| 2015/0243908 A1* | 8/2015 | Lee | C07D 405/10 257/40 |
| 2015/0270498 A1* | 9/2015 | Lee | C09K 11/06 257/40 |
| 2015/0349275 A1 | 12/2015 | Jeong et al. | |
| 2016/0149141 A1* | 5/2016 | Jung | H01L 51/0073 257/40 |
| 2017/0092869 A1* | 3/2017 | Mun | C07C 211/54 |

* cited by examiner

COMPOUND, DISPLAY PANEL, AND DISPLAY DEVICE

CROSS-REFERENCES TO RELATED APPLICATION

This application claims the priority of Chinese Patent Application No. 201911039517.0, filed on Oct. 29, 2019, the content of which is incorporated by reference in its entirety.

TECHNICAL FIELD

The present disclosure generally relates to the field of organic electroluminescence materials and, more particularly, to a compound, a display panel, and a display device.

BACKGROUND

Organic electroluminescent materials (OLED), as a new generation of display material, have the advantages of ultra-thin, self-luminous, wide viewing angle, fast response, high luminous efficiency, good temperature adaptability, facile production, low driving voltage, and small energy consumption. It has been widely used in flat panel display, flexible display, solid-state lighting, and vehicle display.

According to light-emitting mechanisms, light emitted by OLED can be divided into two types: electro-fluorescence and electro-phosphorescence. Fluorescence is light emitted by a radiative decay transition of singlet exciton, and phosphorescence is light emitted by a radiative attenuation of triplet exciton to ground state. According to a theory of spin quantum statistics, the formation probability ratio of singlet excitons and triplet excitons is 1:3. The internal quantum efficiency of fluorescent materials does not exceed 25%, and the external quantum efficiency is generally lower than 5%. The internal quantum efficiency of electro-phosphorescent materials theoretically reaches 100%, and the external quantum efficiency can reach 20%. In 1998, Professor Yuguang Ma of Jilin University in China and Professor Forrest of Princeton University in the United States separately reported the use of europium complex and platinum complex as dyes to dope light-emitting layers. For the first time, they successfully obtained electro-phosphorescence, explained the electro-phosphorescent phenomenon, and pioneered the use of phosphorescent materials in electroluminescent devices.

Due to a long lifetime (μs) of phosphorescent heavy metal materials, triplet-triplet annihilation and concentration quenching may be caused at high current densities, resulting in degradation of device performance. Therefore, heavy metal phosphorescent materials are usually doped into suitable host materials, forming a host-guest doping system to optimize energy transfer and maximize luminous efficiency and lifetime. Currently, the commercialization of heavy metal doping materials has matured, and it is difficult to develop alternative doping materials. Therefore, the development of new phosphorescent host materials has become a new direction.

SUMMARY

One aspect of the present disclosure provides a compound having a formula (I):

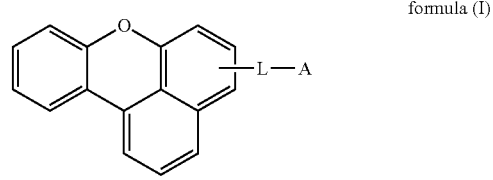

formula (I)

where A represents a nitrogen-containing heteroaromatic ring substituent; and L is one or more selected from a single bond, substituted or unsubstituted C1-C12 alkyl, substituted or unsubstituted C3-C8 cycloalkyl, substituted or unsubstituted C1-C8 alkoxy, substituted or unsubstituted C3-C8 heterocyclyl, substituted or unsubstituted C6-C40 aryl, and substituted or unsubstituted C4-C40 heteroaryl.

Another aspect of the present disclosure provides a display panel including an organic light-emitting device, wherein the organic light-emitting device including an anode, a cathode, and a light-emitting layer located between the anode and the cathode, wherein the light-emitting layer is made of a host material including the compound having the formula (I).

Another aspect of the present disclosure provides a display device including the display panel according to the present disclosure.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
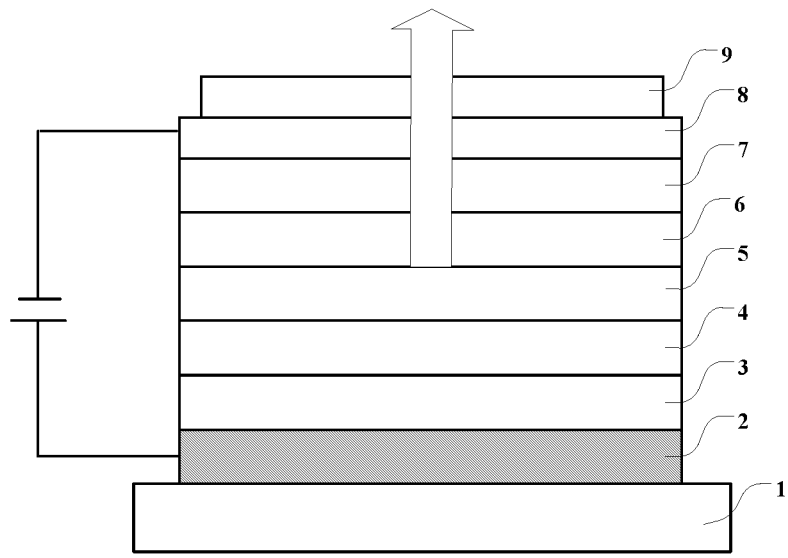
FIG. 1 illustrates an exemplary structure of an organic light-emitting device consistent with various disclosed embodiments of the present disclosure.
Figure 2:
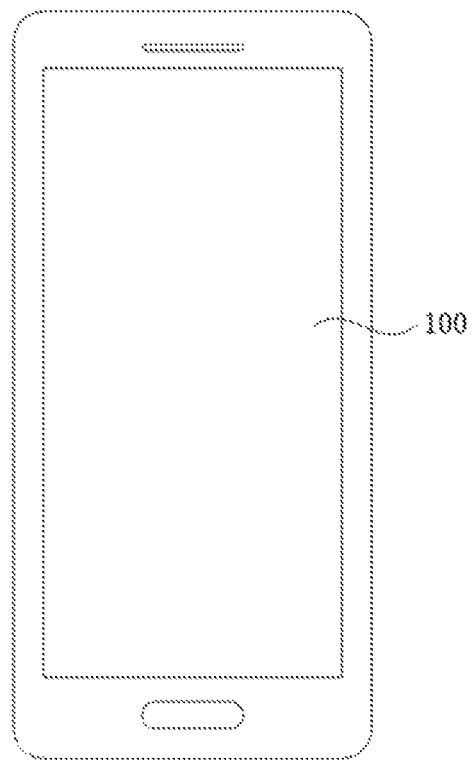
FIG. 2 illustrates an exemplary display screen of a mobile phone consistent with various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

In one embodiment, the present disclosure provides a compound, a display panel, and a display device.

In a specific embodiment, the present disclosure provides a compound having a formula (I),

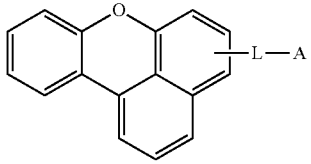

formula (I)

where benzoxanthene is an electron donor D, and A represents an electron acceptor including a nitrogen-containing heteroaromatic ring substituent; L is one or more selected from a single bond, substituted or unsubstituted C1-C12 alkyl, substituted or unsubstituted C3-C8 cycloalkyl, substituted or unsubstituted C1-C8 alkoxy, substituted or unsubstituted C3-C8 heterocyclyl, substituted or unsubstituted C6-C40 aryl, and substituted or unsubstituted C4-C40 heteroaryl.

In one embodiment, L is one or more selected from substituted or unsubstituted C6-C40 aryl and substituted or unsubstituted C4-C40 heteroaryl.

For the compound having oxanthracene as a central skeleton according to the present disclosure, when it is used as a host material of an electroluminescent device, it has a high triplet energy level $E_T$, large molecular density, high glass transition temperature, and good thermal stability. It is easy to form a good amorphous film and reduces the driving voltage of a device. In addition, the compound can effectively improve carriers' balanced migration, widen an exciton recombination region, effectively improve light extraction efficiency, and greatly enhance the light-emitting efficiency and lifespan of a device.

In the present disclosure, the C1-C12 alkyl can be C1-C8 alkyl, C1-C6 alkyl, C1-C4 alkyl, or the like, and may be one or more selected from saturated aliphatic hydrocarbons such as methyl, ethyl, n-propyl, isopropyl, n-butyl, sec-butyl, and tert-butyl.

The C1-C6 alkyl can be C1-C4 alkyl or the like and may be one or more selected from saturated aliphatic hydrocarbons such as methyl, ethyl, n-propyl, isopropyl, n-butyl, sec-butyl, and tert-butyl.

The C3-C8 cycloalkyl can be C3-C6 cycloalkyl and may be one or more selected from cyclopropyl, cyclobutyl, cyclopentyl, and cyclohexyl.

The C1-C8 alkoxy can be C1-C6 alkoxy or C1-C4 alkoxy and may be one or more selected from saturated aliphatic hydrocarbons such as methoxy, ethoxy, n-propoxy, isopropoxy, n-butoxy, sec-butoxy, and tert-butoxy.

The C3-C8 heterocyclyl can be C3-C6 heterocyclyl or C5-C6 heterocyclyl and may be one or more selected from azetidinyl, tetrahydrofuryl, tetrahydropyrrolyl, tetrahydrothienyl, imidazolidinyl, pyridine, oxazolidinyl, thiazolidinyl, piperidinyl, piperazinyl, and morpholinyl.

The C6-C40 aryl may be one or more selected from aromatic hydrocarbon such as phenyl, naphthyl, anthryl, phenanthryl, biphenyl, 9,10-benzophenanthryl, 1,2-benzophenanthryl, 9,9-fluorenyl, benzene terphenyl, acenaphthenyl, perylenyl, pyrenyl, and indenyl.

The C4-C40 heteroaryl may be one or more selected from furyl, thienyl, pyrrolyl, oxazolyl, thiazolyl, pyrazolyl, pyranyl, imidazolyl, pyridyl, pyrazinyl, pyrimidinyl, 1,3,4-oxadiazolyl, 1,2,4-triazolyl, 1,3,5-triazinyl, indolyl, benzimidazolyl, dibenzofuranyl, dibenzothienyl, carbazole, quinolinyl, quinoxalinyl, o-phenanthroline, phenazinyl, and pyridazinyl.

When C1-C12 alkyl, C3-C8 cycloalkyl, C1-C8 alkoxy, C3-C8 heterocyclyl, C6-C40 aryl, and C4-C40 heteroaryl have substituents, the substituents may be selected from alkyl, cycloalkyl, alkoxy, heterocyclyl, aryl, and heteroaryl.

In the present disclosure, unless otherwise specified, the substituents in the "substituted . . . " may be one or more selected from C1-C10 alkyl, C3-C10 cycloalkyl, C2-C10 alkenyl, C1-C6 alkoxy, halogen, cyano, C6-C30 monocyclic aromatic hydrocarbon or fused ring aromatic hydrocarbon, and C3-C30 monocyclic heteroaromatic hydrocarbon or fused ring heteroaromatic hydrocarbon.

The C1-C10 alkyl may be selected from methyl, ethyl, propyl, isopropyl, butyl, isobutyl, pentyl, hexyl, C1-C6 alkyl, and C1-C4 alkyl.

The C3-C10 cycloalkyl may be selected from cyclopropyl, cyclobutyl, cyclopentyl, cyclohexyl, C3-C8 cycloalkyl, and C3-C6 cycloalkyl.

The C2-C10 alkenyl may be selected from vinyl, propenyl, butenyl, C2-C6 alkenyl, and C2-C4 alkenyl.

The C1-C6 alkoxy may be selected from methoxy, ethoxy, propoxy, isopropoxy, butoxy, isobutoxy, and C1-C4 alkoxy.

The halogen includes fluorine, chlorine, bromine, and/or iodine.

For L, in "substituted C1-C12 alkyl", "substituted C3-C8 cycloalkyl", "substituted C1-C8 alkoxy", "substituted C3-C8 heterocyclyl", "substituted C6-C40 aryl", and "substituted C4-C40 heteroaryl", the substitute is defined as above.

In the present disclosure, in the case the connection position is not clearly indicated, or the connection position is indicated by #, groups and substituents may be connected to each other at any position, as long as corresponding compounds can be synthesized.

In one embodiment, L is one or more selected from the following:

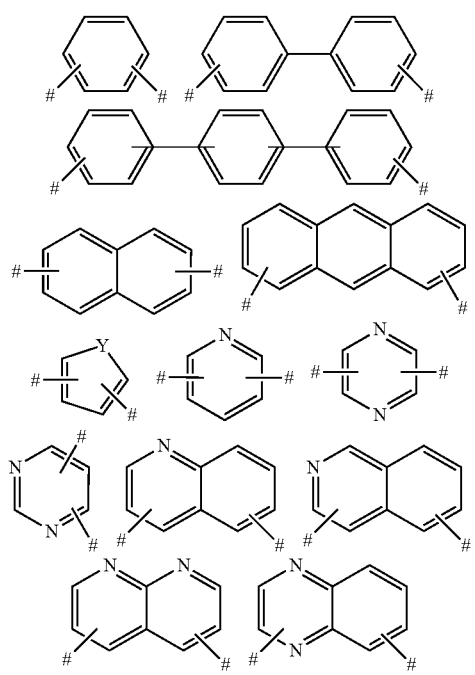

-continued

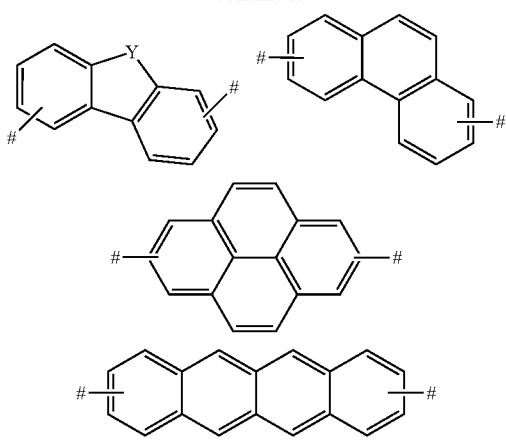

where Y is selected from carbon atom, nitrogen atom, oxygen atom, sulfur atom, and silicon atom; and each # independently represents a connection position.

In one embodiment, L is one or more selected from the following:

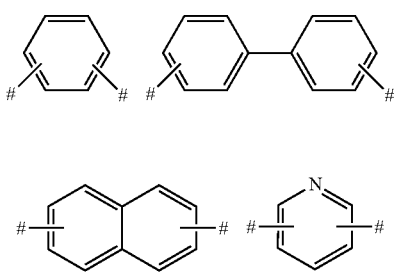

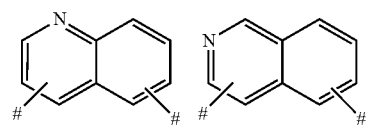

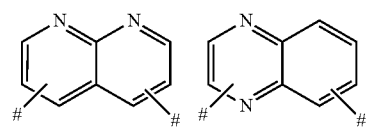

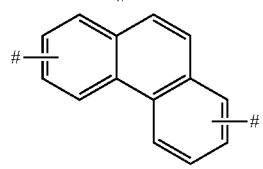

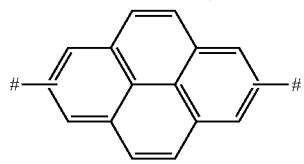

where each # independently represents a connection position.

In one embodiment, A is at least one selected from the following:

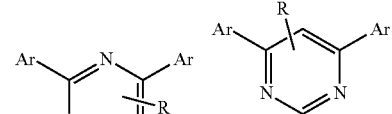

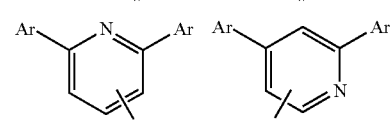

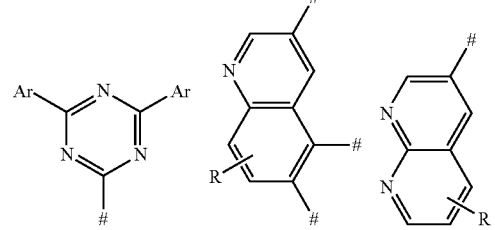

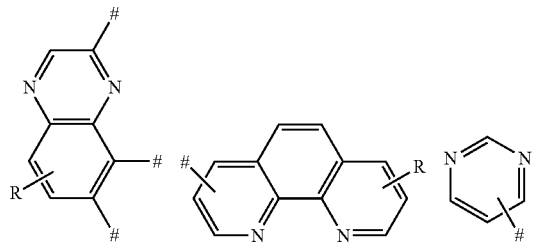

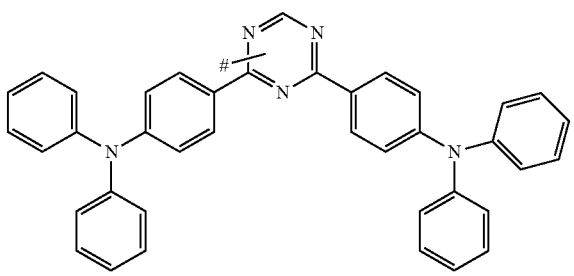

where each Ar is independently selected from substituted or unsubstituted C6-C40 aryl, and the substituent is one or more selected from C1-C6 alkyl, C1-C6 alkoxy, and halogen; each R is independently selected from hydrogen atom, C1-C12 alkyl, C1-C8 alkoxy, C3-C8 cycloalkyl, C6-C40 aryl, and C4-C40 heteroaryl; and each # independently represents a connection position.

For Ar, in substituted C6-C40 aryl, the substituent C1-C6 alkyl can be C1-C4 alkyl and may be elected from one or more of saturated aliphatic hydrocarbons such as methyl, ethyl, n-propyl, isopropyl, n-butyl, sec-butyl, or tert-butyl; the substituent C1-C6 alkoxy can be C1-C4 alkoxy and may be one or more selected from saturated aliphatic alkoxy such as methoxy, ethoxy, n-propoxy, isopropoxy, n-butoxy, sec-butoxy, or tert-butoxy; and the substituent halogen may be selected from fluorine, chlorine, bromine, and/or iodine.

In one embodiment, each Ar is independently selected from substituted or unsubstituted phenyl, naphthyl, biphenyl, anthracenyl, and phenanthryl, and the substituent is one or more selected from C1-C6 alkyl and halogen.

The "C1-C6 alkyl" and "halogen" are defined as above.

In one embodiment, A is at least one selected from the following:

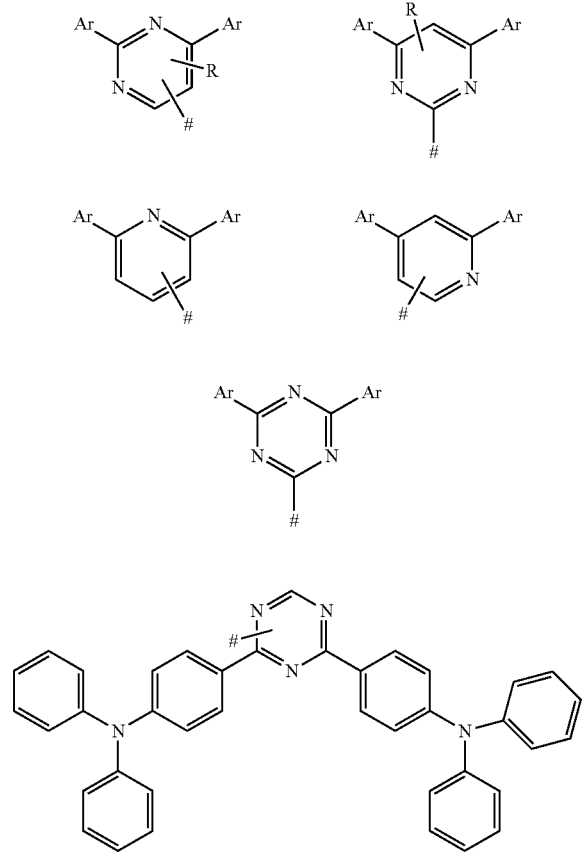

where each Ar is independently selected from substituted or unsubstituted phenyl, naphthyl, biphenyl, anthracenyl, and phenanthryl, and the substituent is one or more selected from C1-C6 alkyl and halogen; each R is independently selected from hydrogen atom and C1-C6 alkyl; and each # independently represents a connection position.

In one embodiment, the compound is selected from any one of H001 to H096.

H001

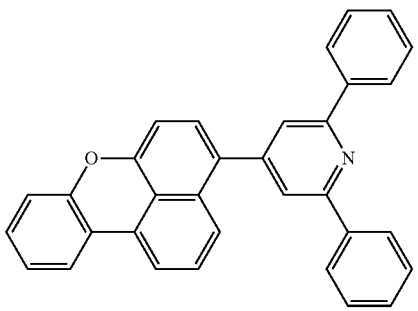

H002

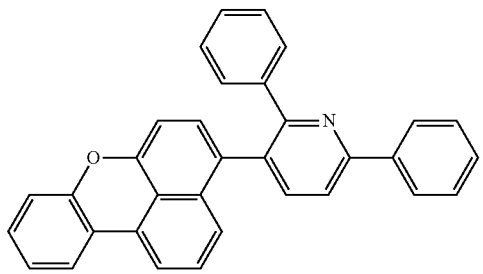

H003

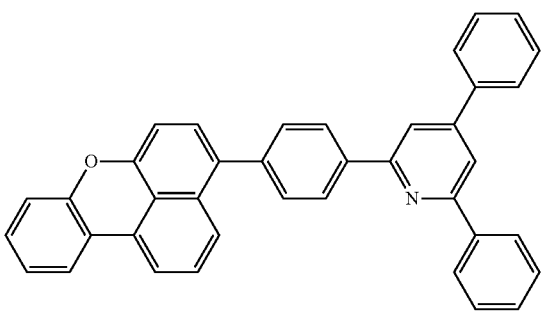

H004

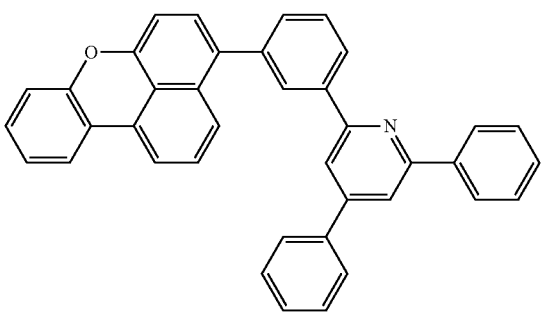

H005

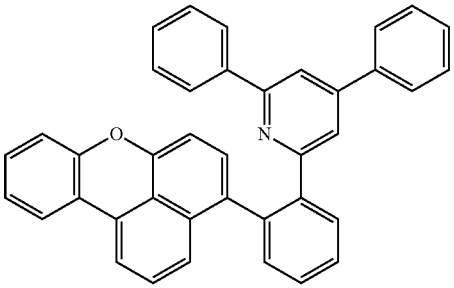

H006

H007
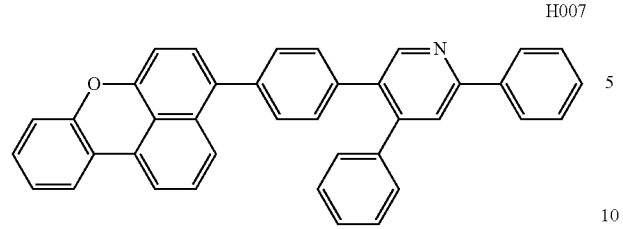
H008
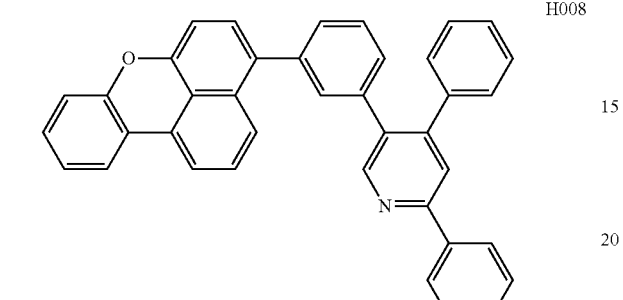
H009
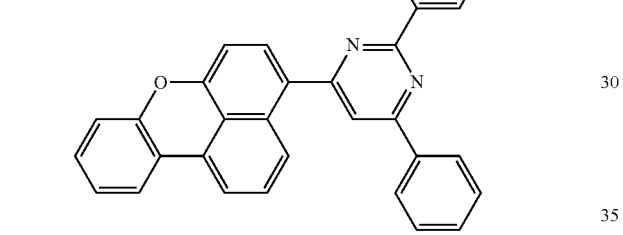
H010
H011
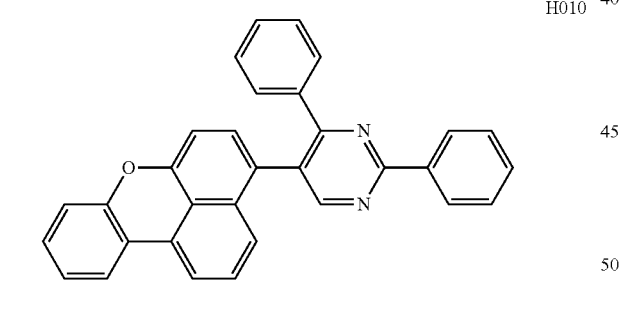
H012
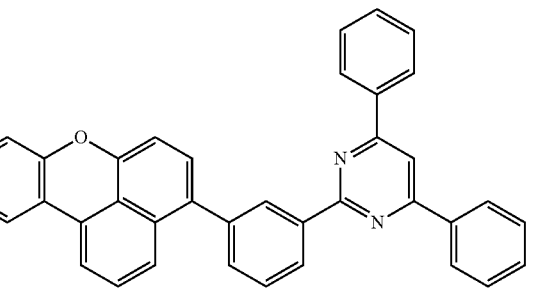
H013
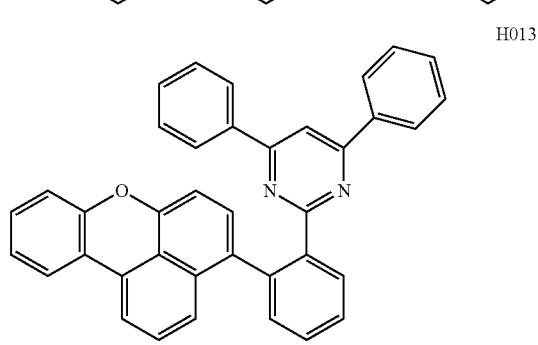
H014
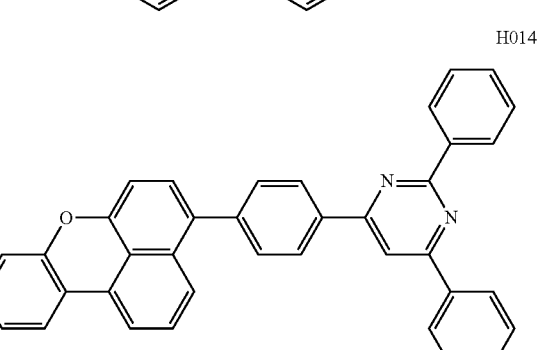
H015
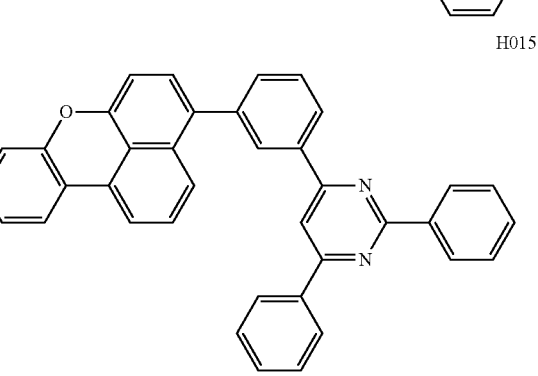
H016
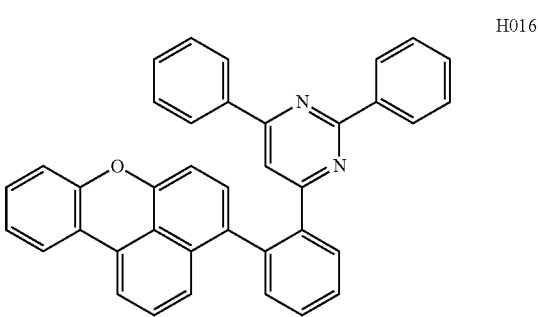

-continued
H017
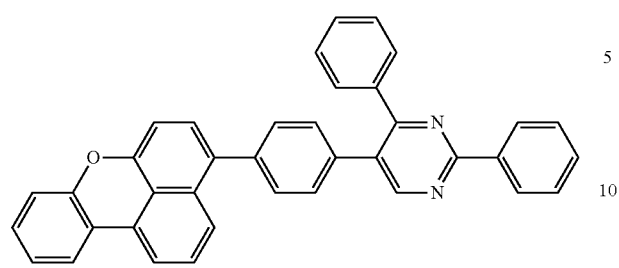
H018
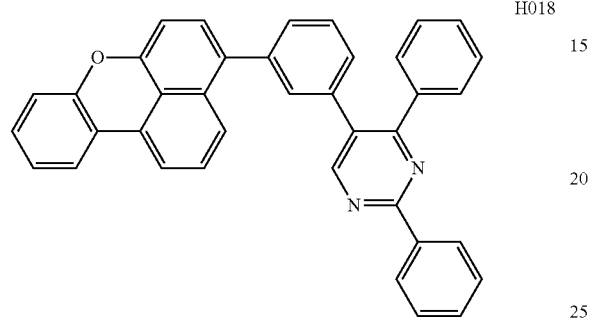
H019
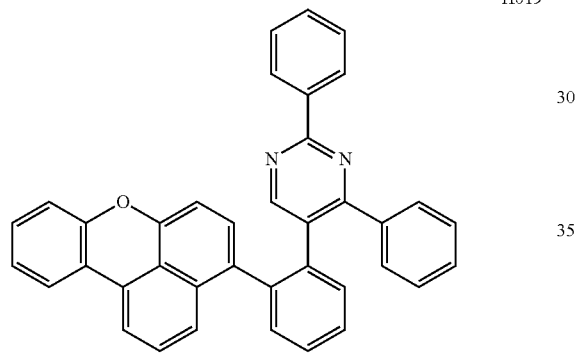
H020
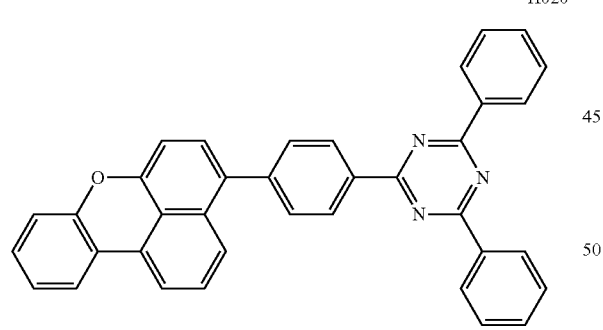
H021
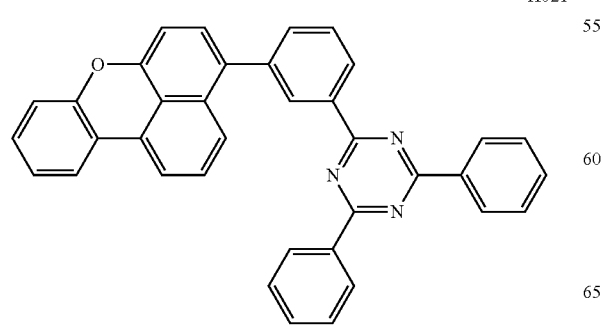
-continued
H022
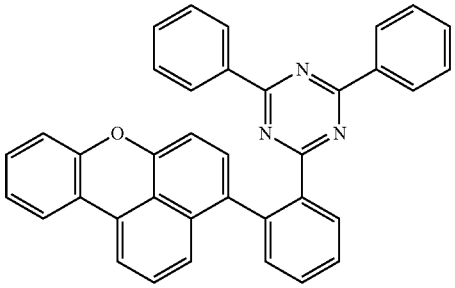
H023
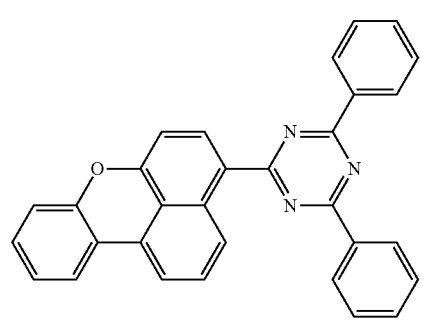
H024
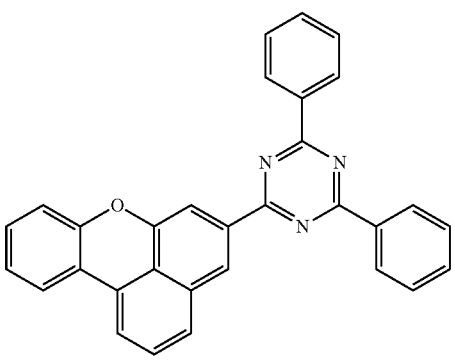
H025
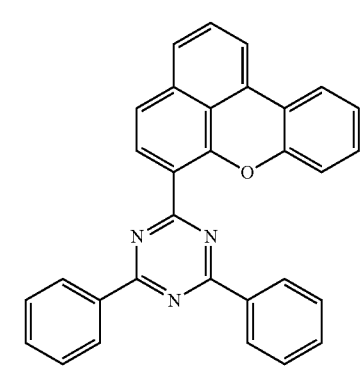
H026
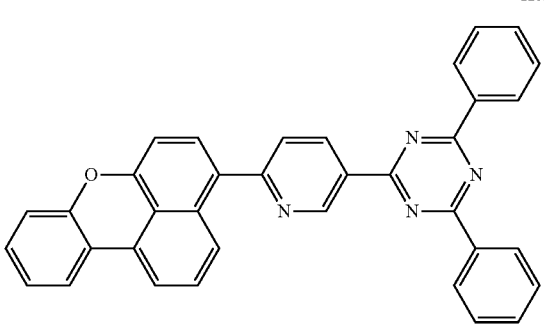

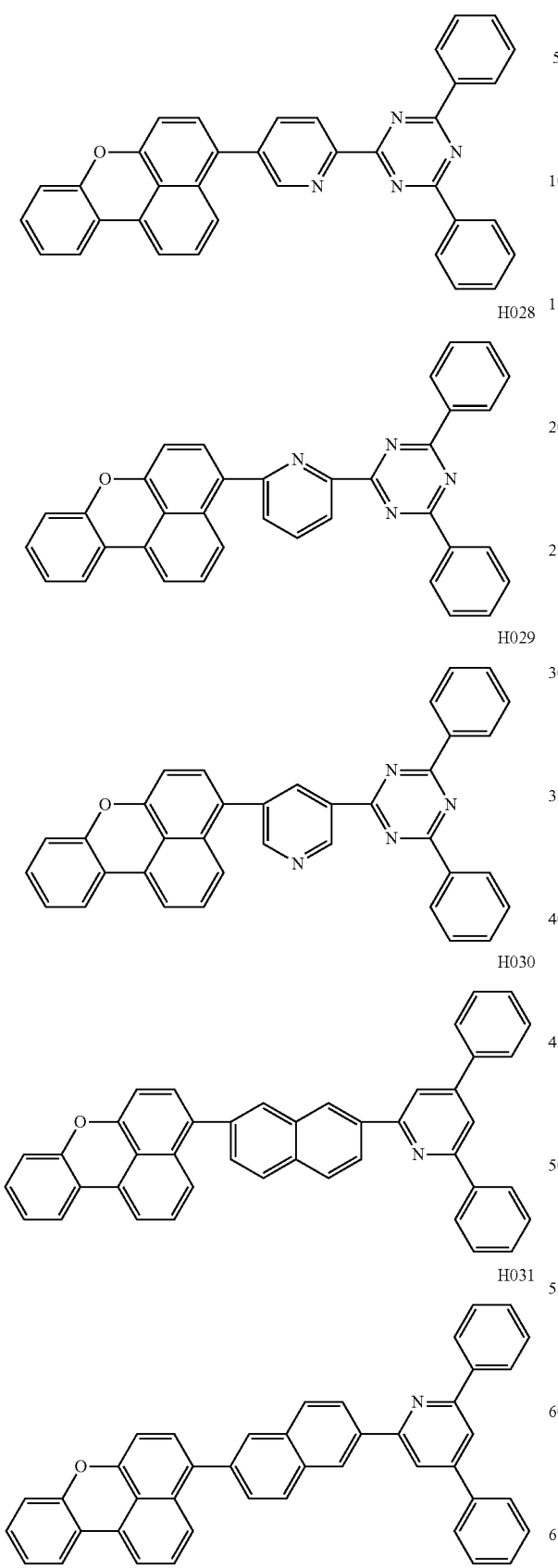
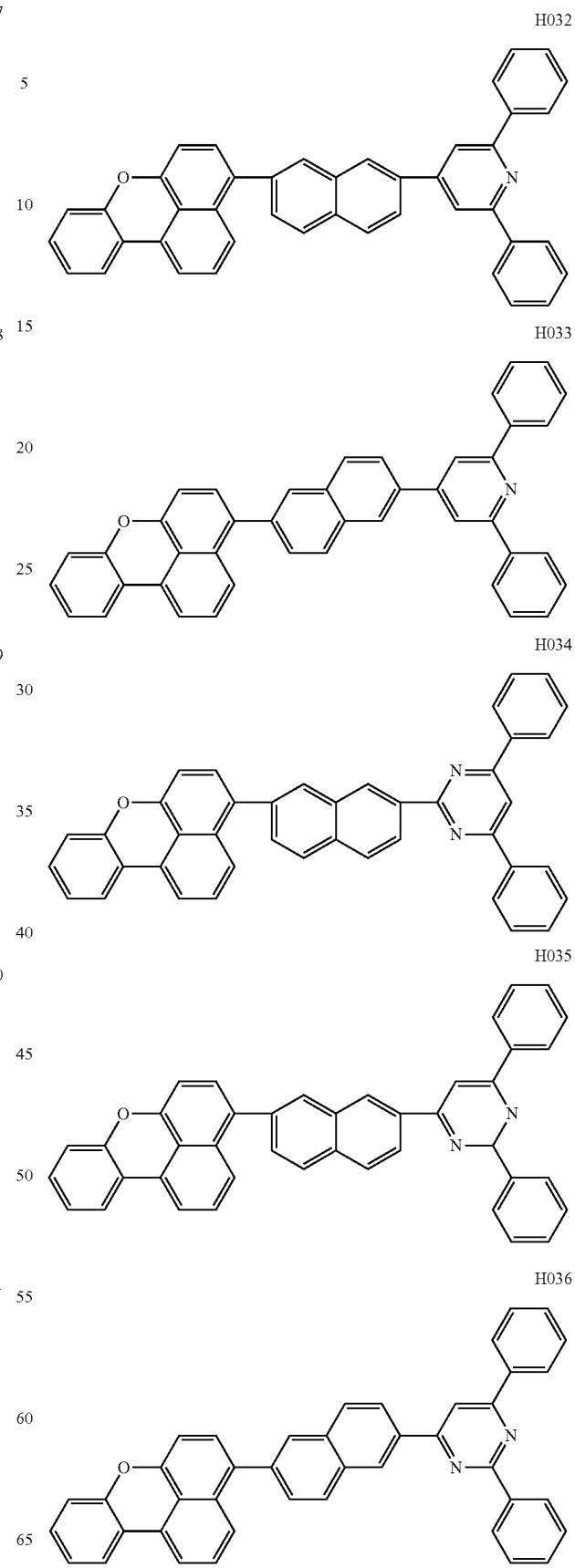

H037
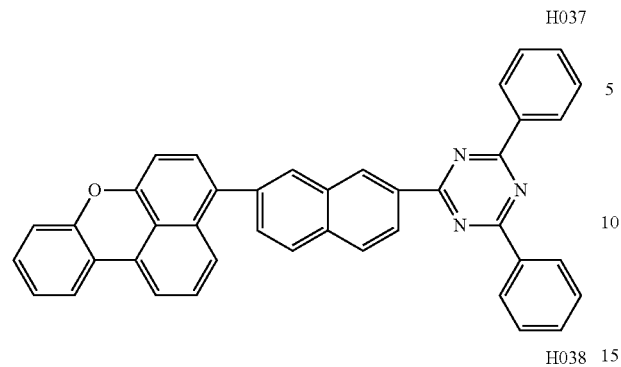
H038
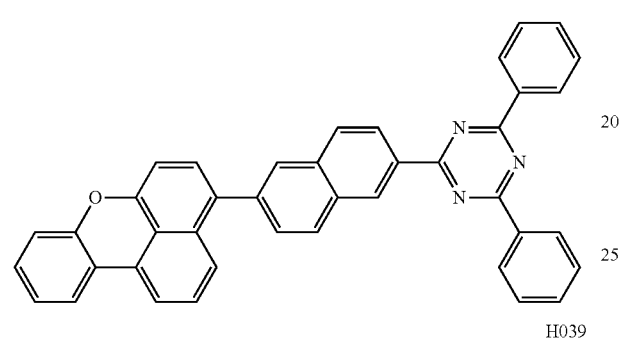
H039
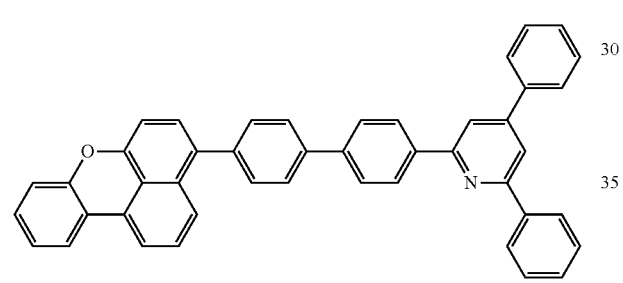
H040
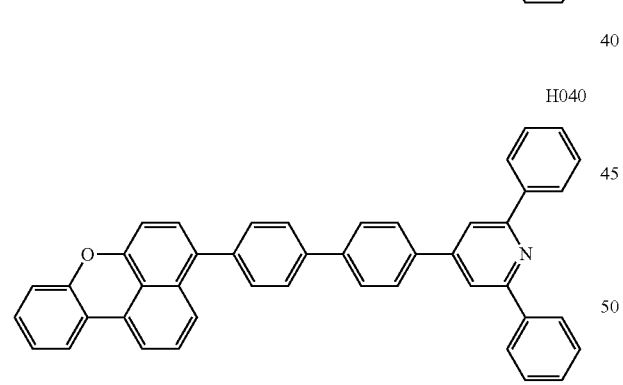
H041
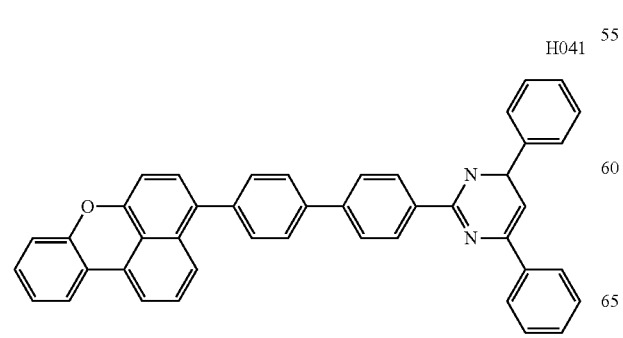
H042
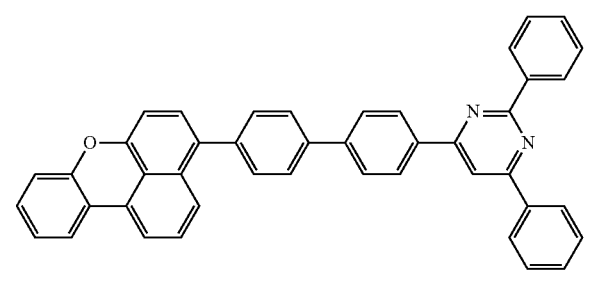
H043
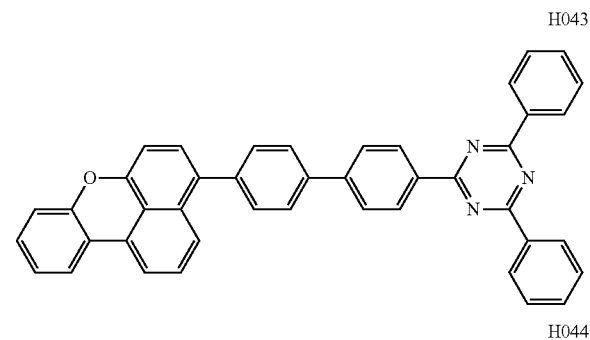
H044
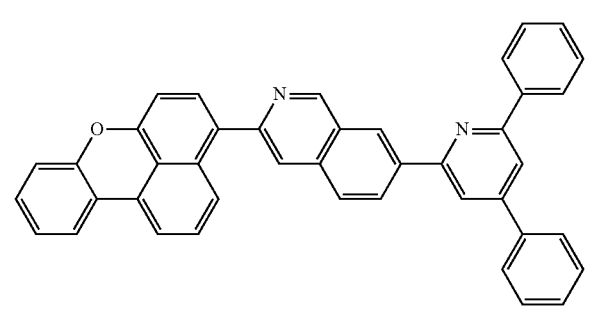
H045
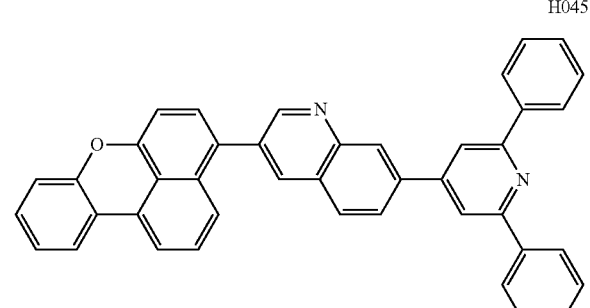
H046
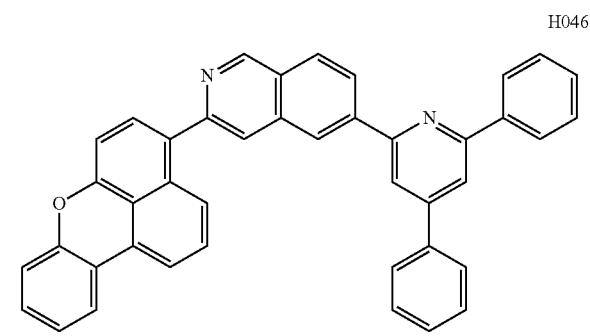

H047
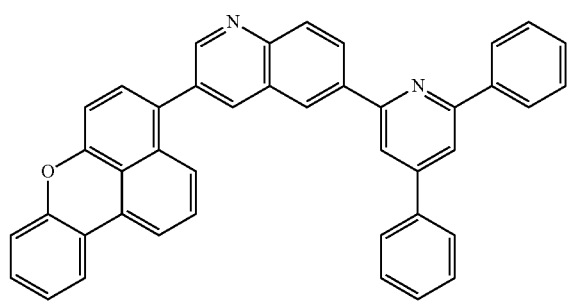
H048
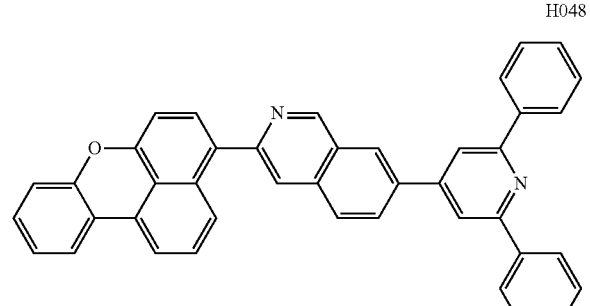
H049
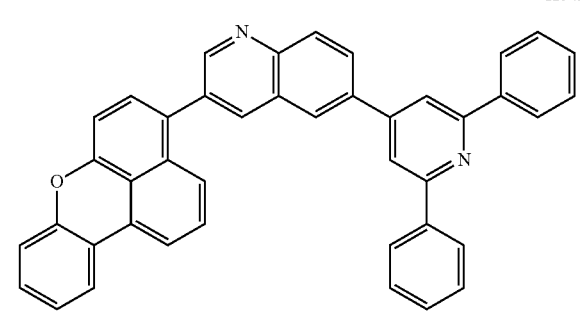
H050
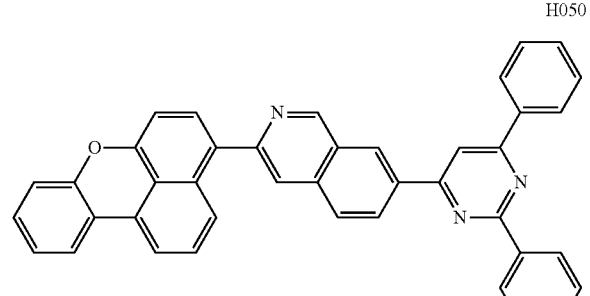
H051
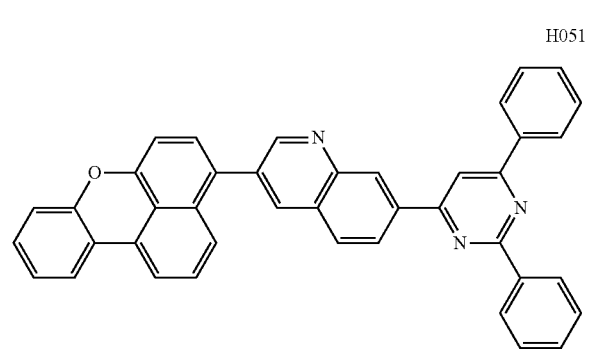
H052
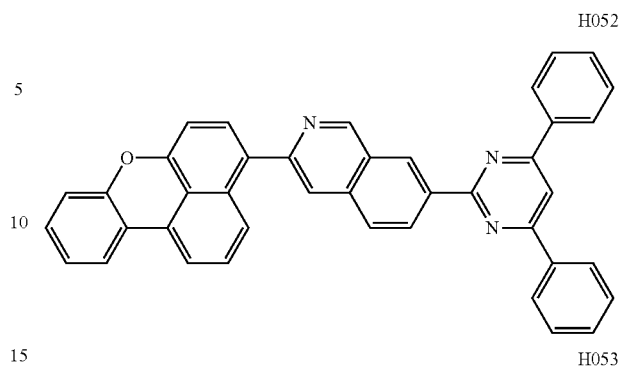
H053
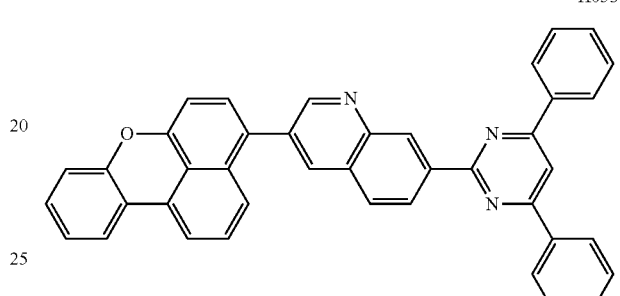
H054
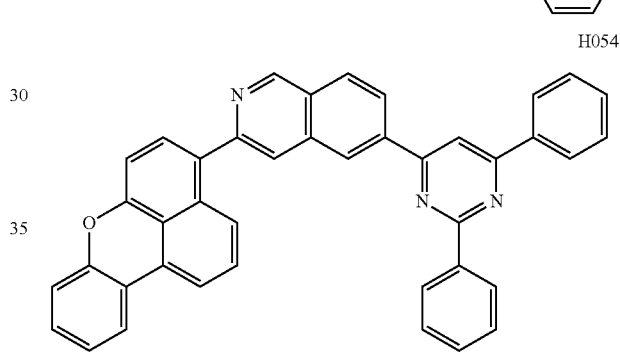
H055
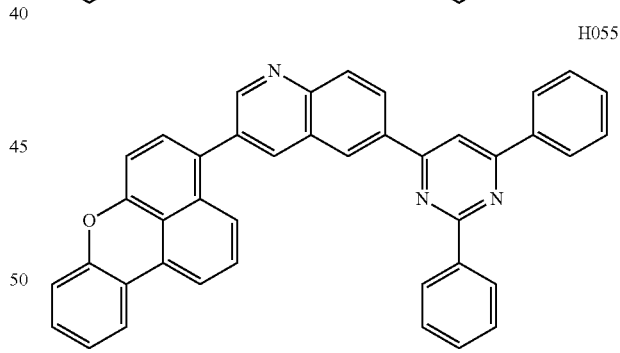
H056
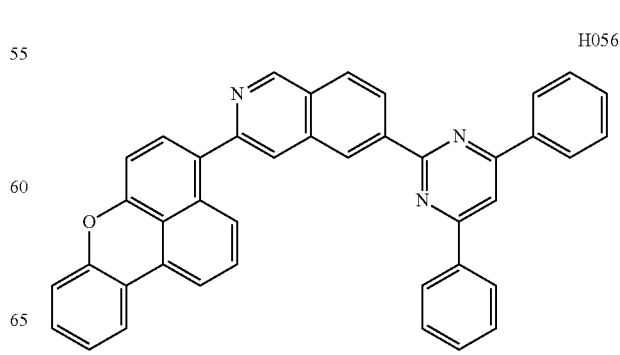

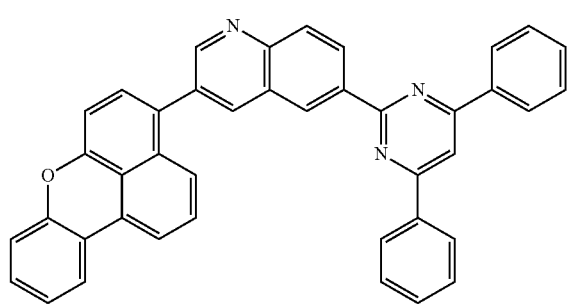
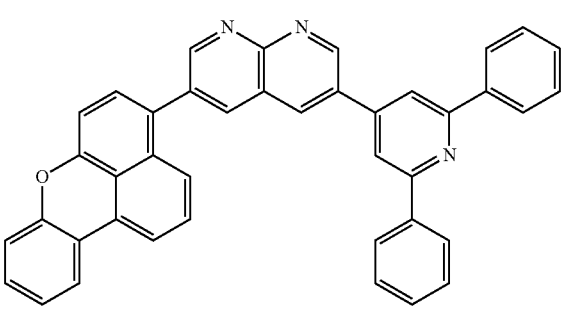
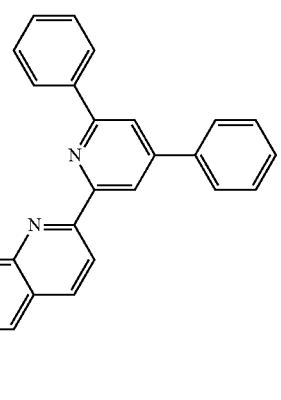
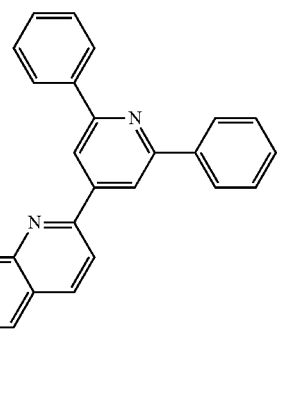
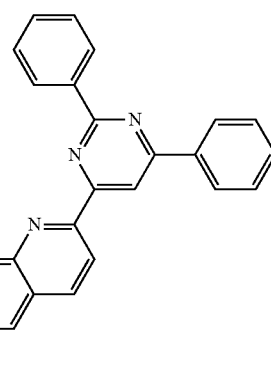

H065
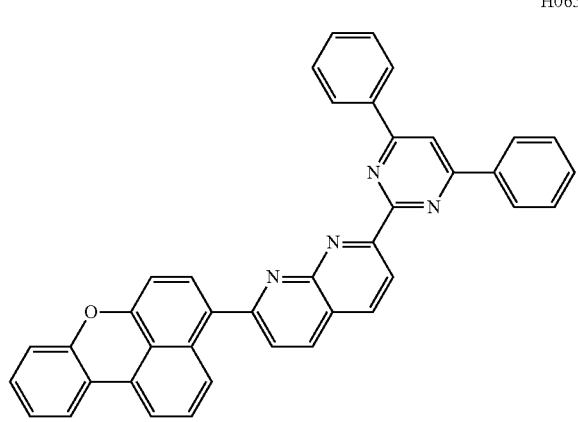
H066
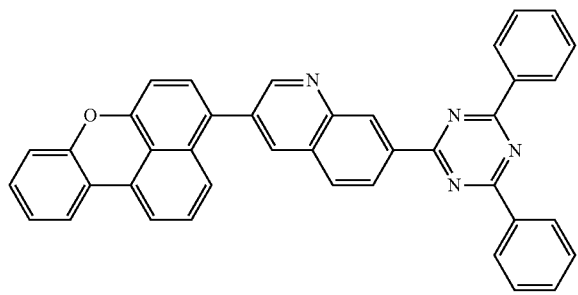
H067
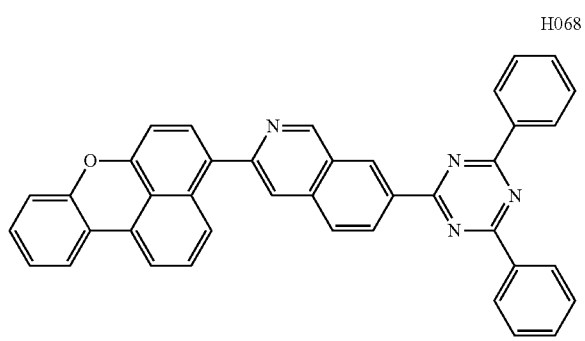
H068
H069
H070
H071
H072
H073
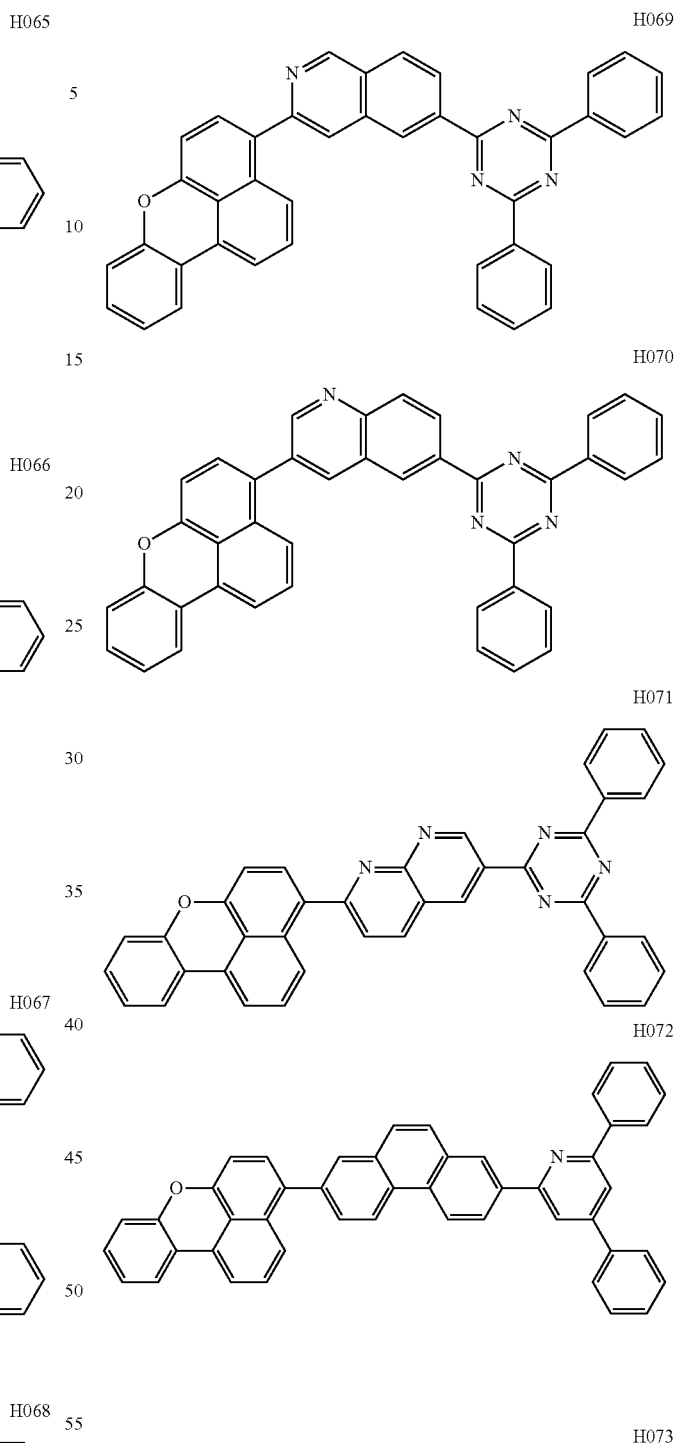

H074
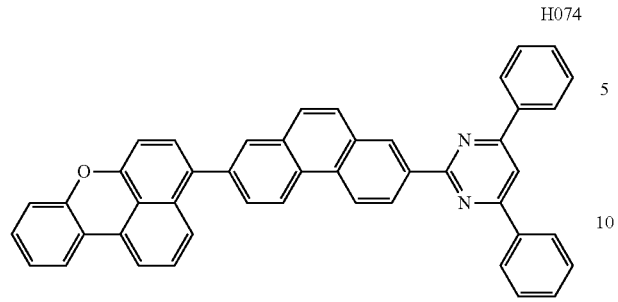
H075
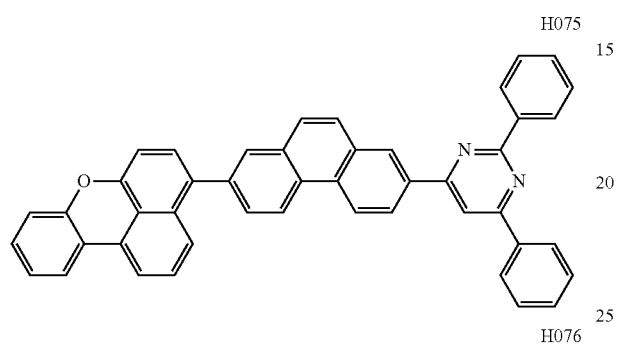
H076
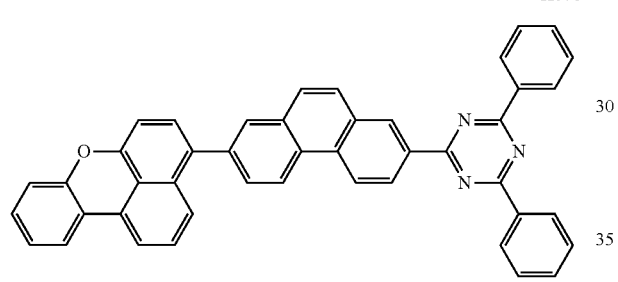
H077
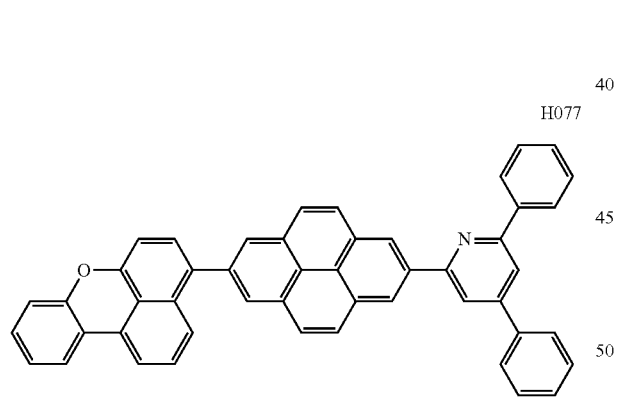
H078
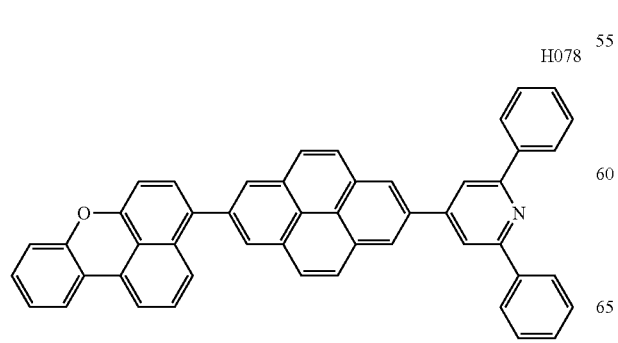
H079
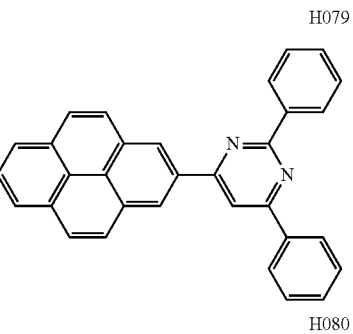
H080
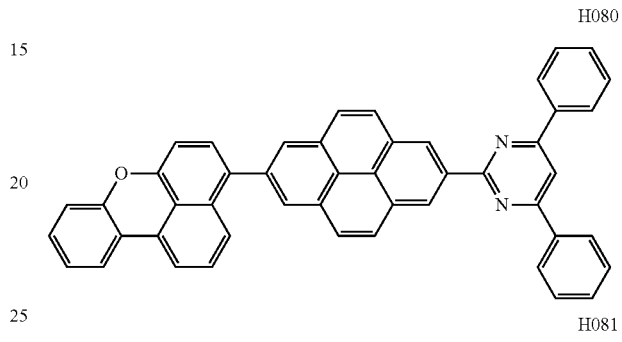
H081
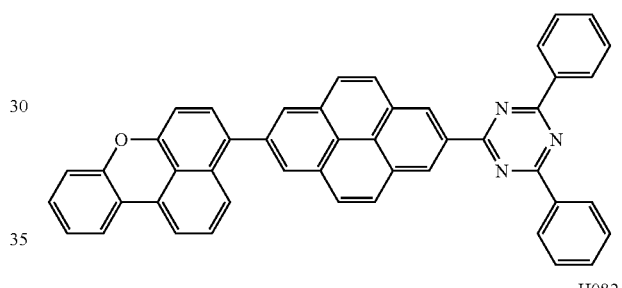
H082
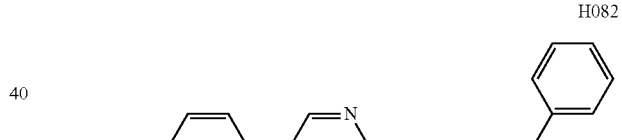
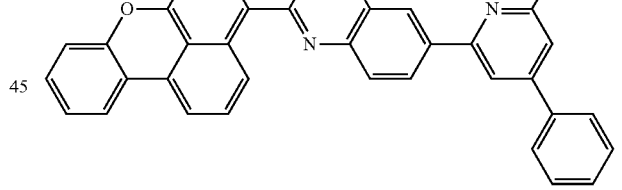
H083
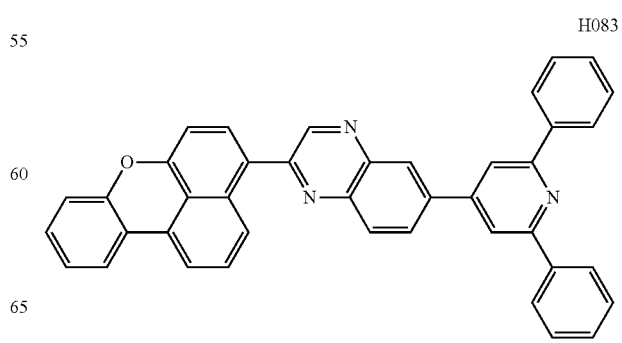

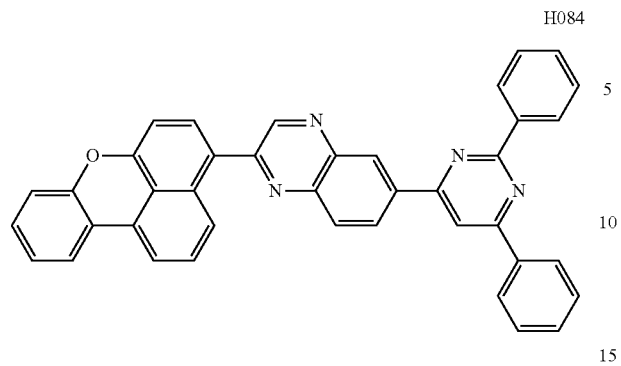
H084
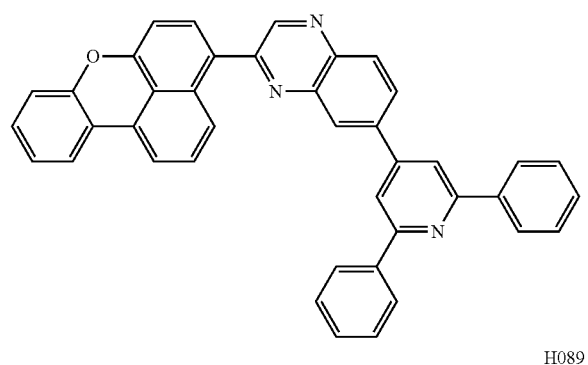
H088
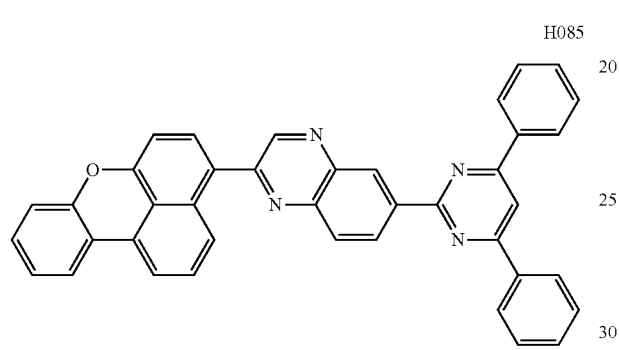
H085
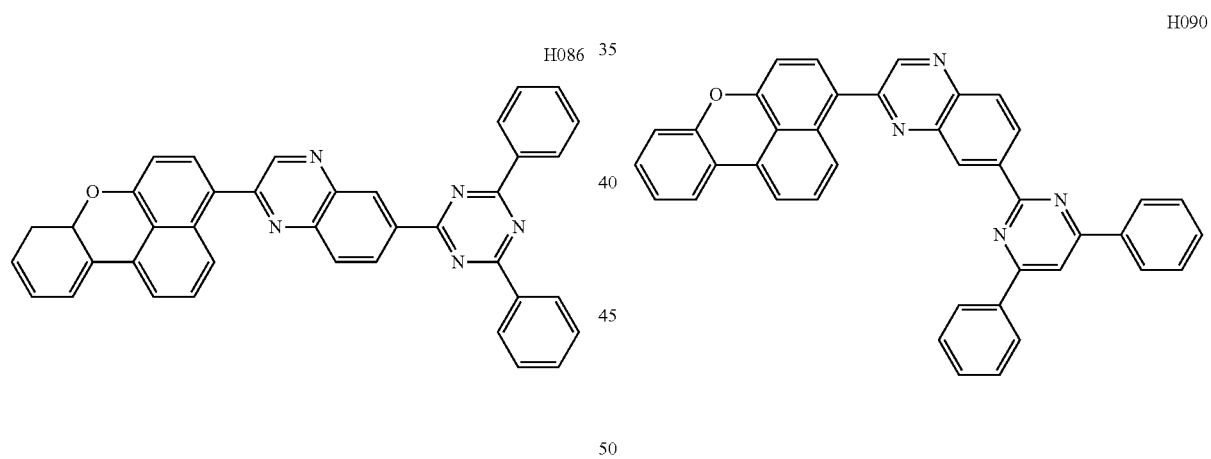
H086
H089
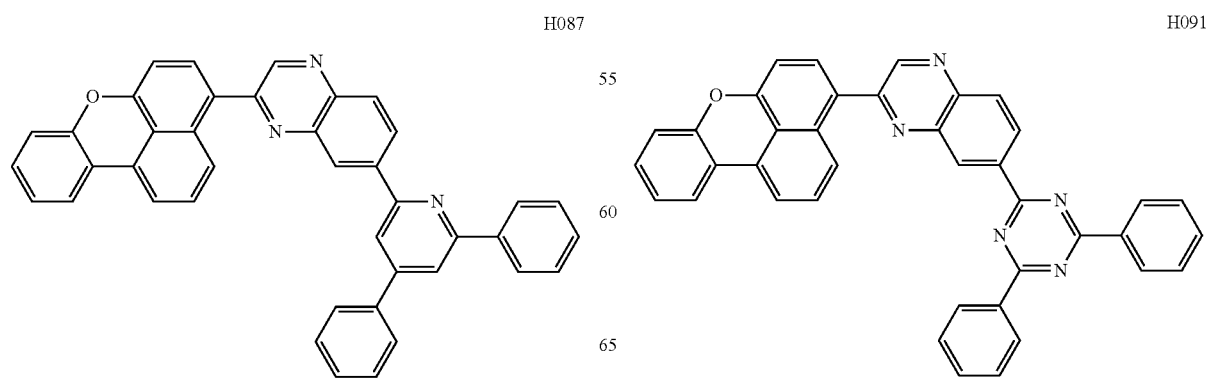
H087
H090
H091

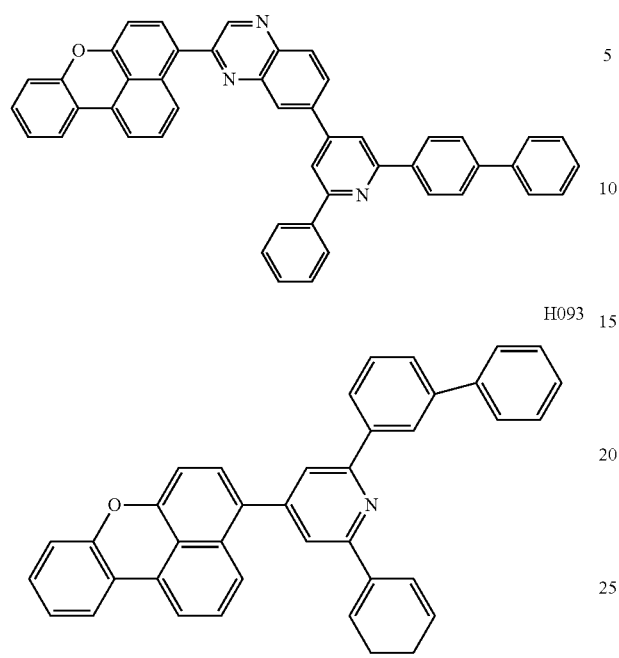

H092

H093

H094

H095

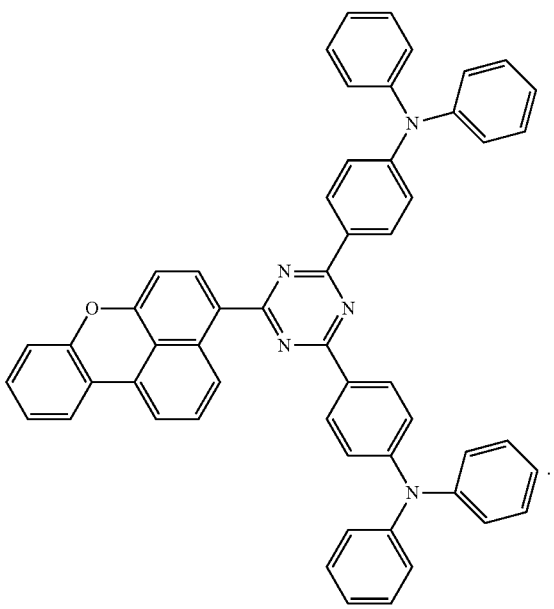

H096

In one embodiment, the compound is any one selected from H002, H009, H020, H094, and H096.

In another embodiment, the present disclosure provides a display panel including an organic light-emitting device. The organic light-emitting device includes an anode, a cathode, and a light-emitting layer between the anode and the cathode. The light-emitting layer is made of a host material including the compound according to the present disclosure.

In one embodiment, the host material has a singlet energy level S1 higher than the singlet energy level S1 of a guest material, and a difference between singlet energy level S1 of the host material and singlet energy level S1 of the guest material is less than 0.8 eV; the host material has a triplet energy level T1 higher than the triplet energy level T1 of a guest material, and a difference between triplet energy level T1 of the host material and triplet energy level T1 of the guest material is less than 0.4 eV.

In one embodiment, the host material of the light-emitting layer is a red light-emitting material, and the red light-emitting material has a lowest triplet energy level T1 of 2.2 eV.

In one embodiment, the host material of the light-emitting layer is a green light-emitting material, and the green light-emitting material has a lowest triplet energy level T1 of 2.5 eV.

In one embodiment, the host material of the light-emitting layer is a blue light-emitting material, and the blue light-emitting material has a lowest triplet energy level T1 of 2.7 eV.

In one embodiment, the organic light-emitting device includes one or more of a capping layer, a first hole transport layer, a second hole transport layer, a first electron transport layer, and a second electron transport layer.

In one embodiment, at least one of the capping layer, the first hole transport layer, the second hole transport layer, the first electron transport layer, and the second electron transport layer include the compound according to the present disclosure.

In another embodiment, the present disclosure provides a display device including the display panel according to the present disclosure.

In one embodiment, the display device includes but not limited to a mobile phone display screen, a computer display screen, a liquid crystal television display screen, or the like.

The embodiments of the present disclosure are only intended to describe the present disclosure in detail and are not intended to limit the present disclosure. Methods for the synthesis of the compound of the present disclosure will be described below.

Exemplary Embodiment 1: Synthesis of Compound H002

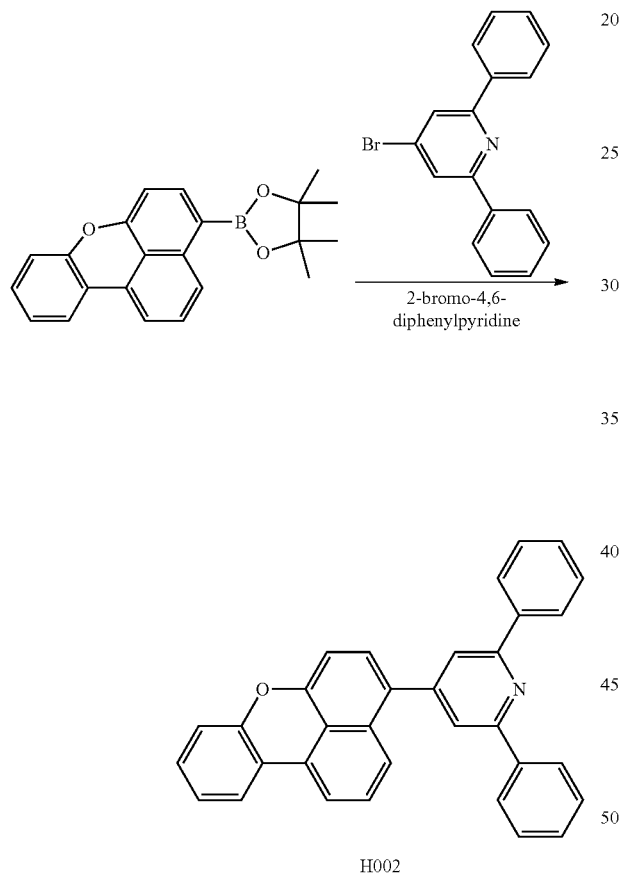

In a 250 mL round bottom flask, 10 mmol of BB (molecular structure is shown as below), 12 mmol of 2-bromo-4,6-diphenylpyridine, and 0.6 mmol of tetrakis (triphenylphosphine) palladium are added into 15 mL of tetrahydrofuran (THF). 10 mL of $K_2CO_3$ solution (2M) is added with constant stirring to form a mixture solution. The mixture solution is heated and refluxed at 80° C. for 18 hours. When a reaction is completed, the solution is cooled to room temperature and added with 100 mL of water. The resulting mixture is filtered and washed three times with 25 mL of dichloroethane, and then dried with anhydrous magnesium sulfate. The obtained product is further purified using a silica gel column to obtain the product H002.

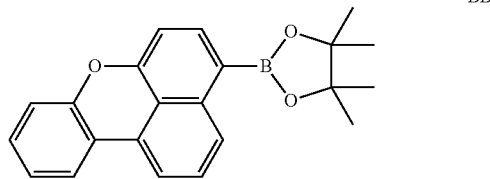

BB

Elemental analyses for the compound H002 (molecular formula: $C_{33}H_{21}NO$) are as follows. Theoretical molecular weight of H002 is 447.53, including 88.56% of C, 4.73% of H, 3.13% of N, and 3.58% of O.

Exemplary Embodiment 2: Synthesis of Compound H009

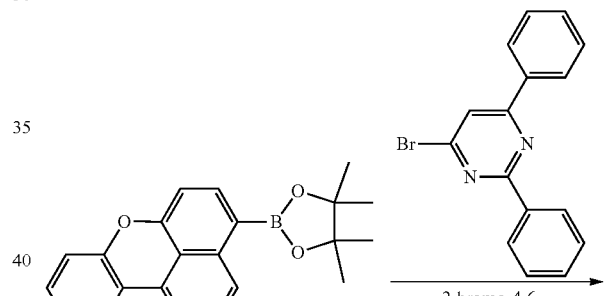

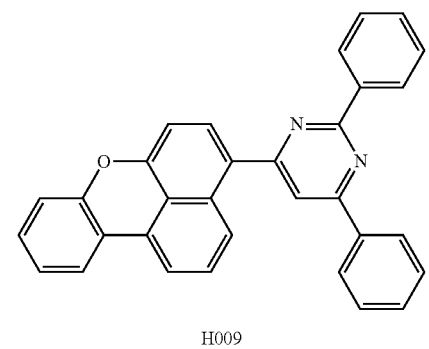

H009

In a 250 mL round bottom flask, 10 mmol of BB, 12 mmol of 2-bromo-4,6-diphenylacridine, and 0.6 mmol of tetrakis (triphenylphosphine) palladium are added into 15 mL of tetrahydrofuran (THF). 10 mL of $K_2CO_3$ solution (2M) is added with constant stirring to form a mixture solution. The mixture solution is heated and refluxed at 80° C. for 18 hours. When a reaction is completed, the solution is cooled to room temperature and added with 100 mL of water. The resulting mixture is filtered and washed three times with 25 mL of dichloroethane, and then dried with anhydrous magnesium sulfate. The obtained product is further purified using a silica gel column to obtain the product H009.

Elemental analyses for the compound H009 (molecular formula: $C_{32}H_{20}N_2O$) are as follows. Theoretical molecular weight of H009 is 448.51, including 85.69% of C, 4.49% of H, 6.25% of N, and 3.57% of O.

Exemplary Embodiment 3: Synthesis of Compound H094

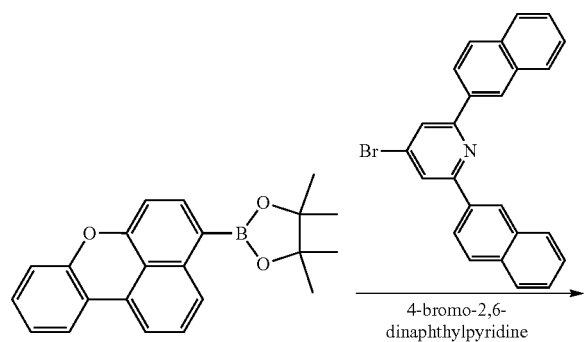

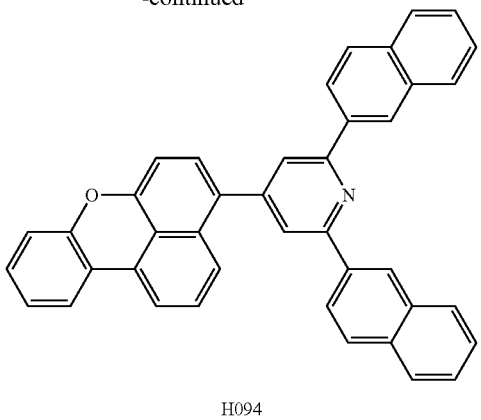

H094

In a 250 mL round bottom flask, 10 mmol of BB, 12 mmol of 4-bromo-2,6-dinaphthylpyridine, and 0.6 mmol of tetrakis (triphenylphosphine) palladium are added into 15 mL of tetrahydrofuran (THF). 10 mL of $K_2CO_3$ solution (2M) is added with constant stirring to form a mixture solution. The mixture solution is heated and refluxed at 80° C. for 18 hours. When a reaction is completed, the solution is cooled to room temperature and added with 100 mL of water. The resulting mixture is filtered and washed three times with 25 mL of dichloroethane, and then dried with anhydrous magnesium sulfate. The obtained product is further purified using a silica gel column to obtain the product H094.

Elemental analyses for the compound H094 (molecular formula: $C_{41}H_{25}NO$) are as follows. Theoretical molecular weight of H094 is 547.64, including 89.92% of C, 4.60% of H, 2.56% of N, and 2.92% of O.

Exemplary Embodiment 4: Synthesis of Compound H020

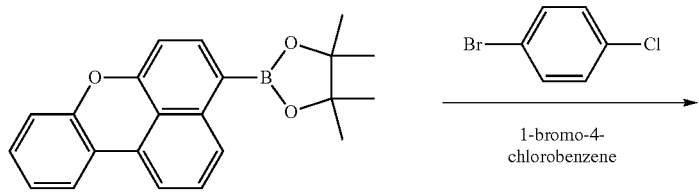

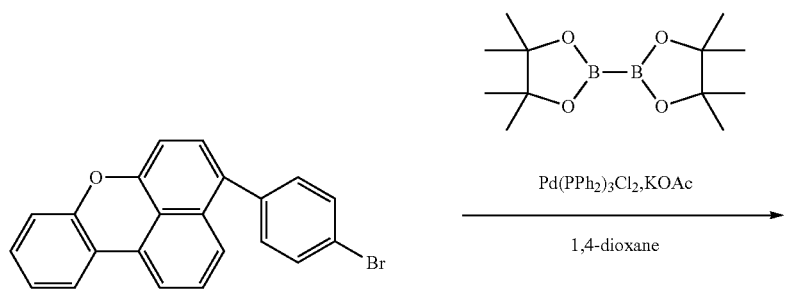

-continued

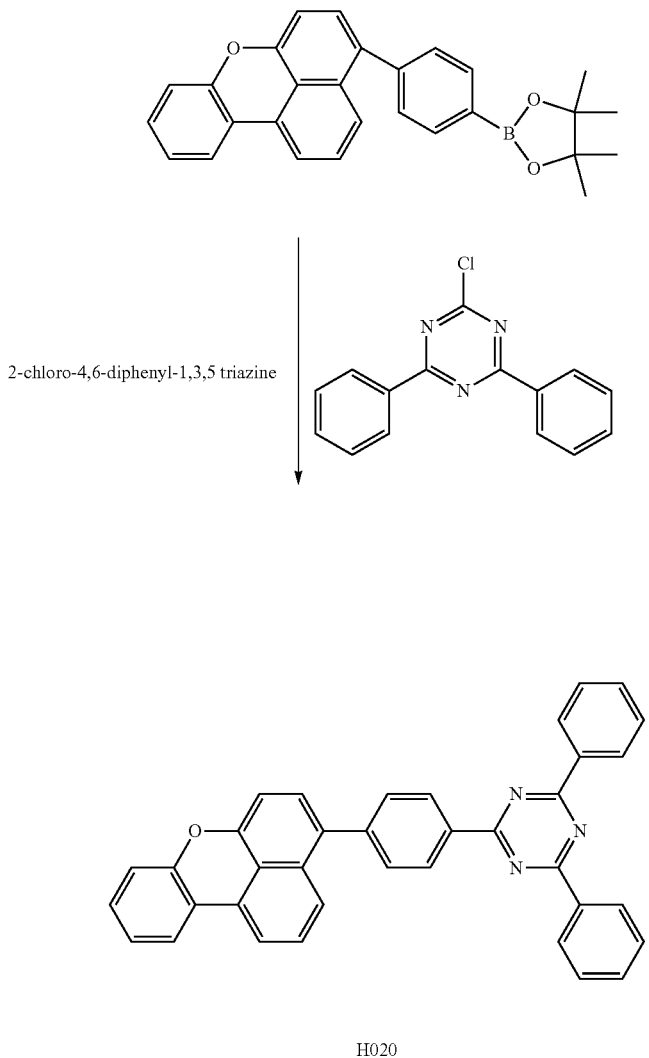

2-chloro-4,6-diphenyl-1,3,5 triazine

H020

In a 250 mL round bottom flask, 10 mmol of BB, 12 mmol of 1-bromo-4-chlorobenzene, and 0.6 mmol of tetrakis (triphenylphosphine) palladium are added into 15 mL of tetrahydrofuran (THF). 10 mL of $K_2CO_3$ solution (2M) is added with constant stirring to form a mixture solution. The mixture solution is heated and refluxed at 80° C. for 18 hours. When a reaction is completed, the solution is cooled to room temperature and added with 100 mL of water. The resulting mixture is filtered and washed three times with 25 mL of dichloroethane, and then dried with anhydrous magnesium sulfate. The obtained product is further purified using a silica gel column to obtain an intermediate product H020-1.

In a 250 mL round bottom flask, 15 mmol of H020-1 and 40 mmol of potassium acetate are mixed with 60 mL of dry 1,4-dioxane, 0.4 mmol of $Pd(PPh3)_2Cl_2$, and 25 mmol of bis(pinacolato)diborane under stirring in a nitrogen atmosphere at 90° C. for 48 hours to obtain an intermediate. The intermediate is cooled to room temperature, added into water, filtered through a pad of celite while being extracted with dichloromethane, washed with water, and dried using anhydrous magnesium sulfate. After filtration and evaporation, a crude product is purified by silica gel column chromatography to obtain an intermediate product H020-2.

In a 250 mL round bottom flask, 10 mmol of intermediate H020-2, 12 mmol of 2-chloro-4,6-diphenyl-1,3,5 triazine, 76 mmol of $K_2CO_3$, and 20 mL of dimethylimine sulfone are mixed and refluxed under stirring in a nitrogen atmosphere at 150° C. for 12 hours. When a reaction is completed, the solution is cooled to room temperature and added with 100 mL of water. The resulting mixture is filtered and washed three times with 25 mL of dichloroethane, and then dried with anhydrous magnesium sulfate. The obtained product is further purified using a silica gel column to obtain the product H020.

Elemental analyses for the compound H020 (molecular formula: $C_{37}H_{23}N_3O$) are as follows. Theoretical molecular weight of H020 is 525.60, including 84.55% of C, 4.41% of H, 7.99% of N, and 3.04% of O.

Exemplary Embodiment 5: Synthesis of Compound H096
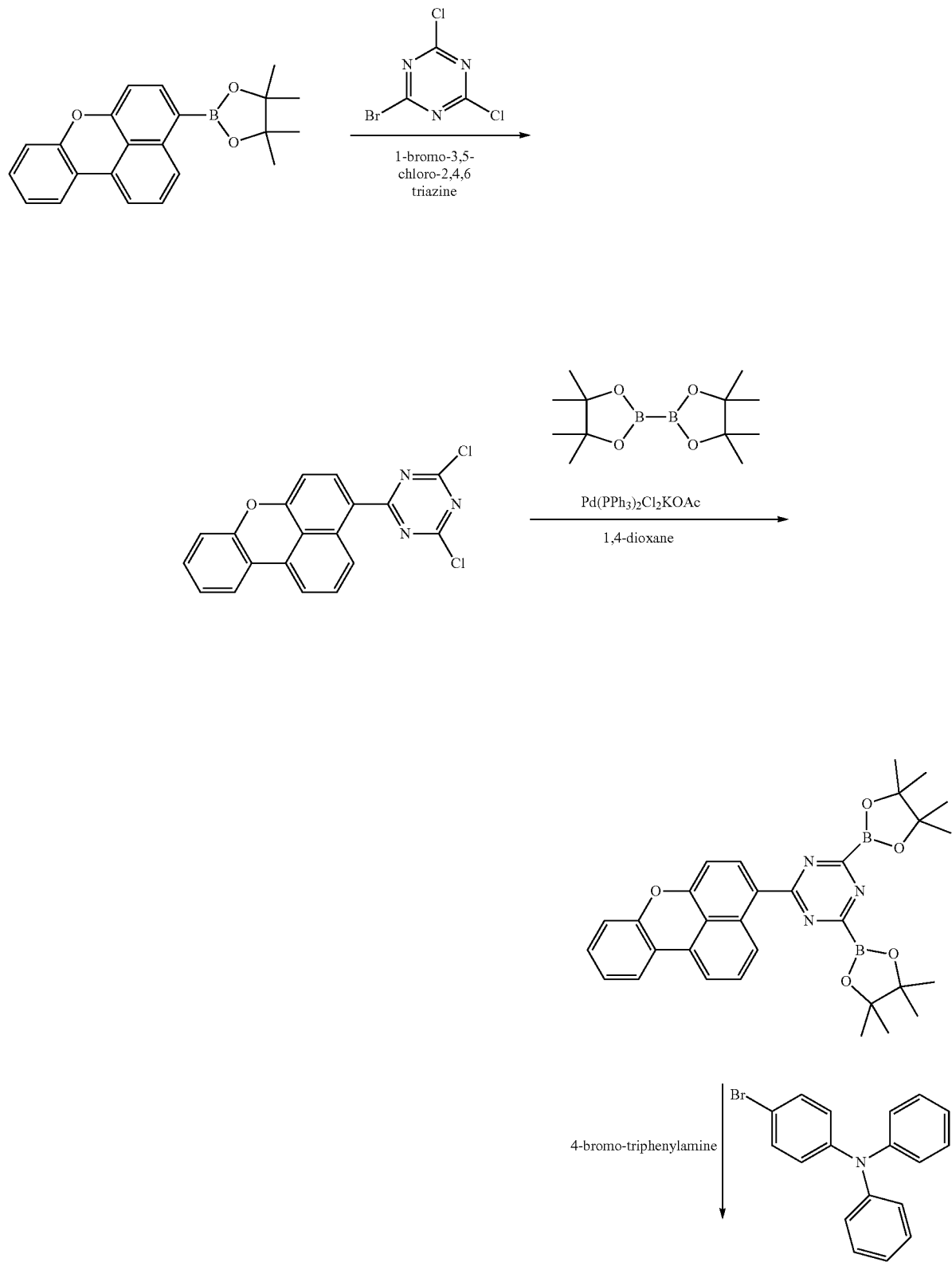

-continued

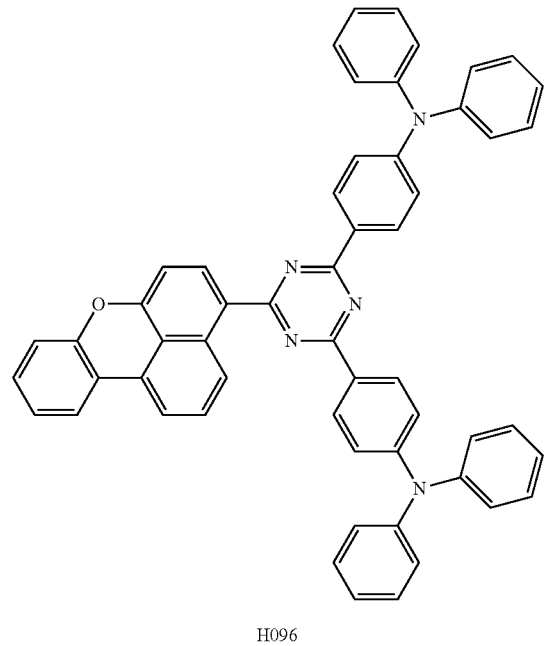

H096

In a 250 mL round bottom flask, 10 mmol of BB, 12 mmol of 1-bromo-3,5-chloro-2,4,6 triazine, and 0.6 mmol of tetrakis (triphenylphosphine) palladium are added into 15 mL of tetrahydrofuran (THF). 10 mL of $K_2CO_3$ solution (2M) is added with constant stirring to form a mixture solution. The mixture solution is heated and refluxed at 80° C. for 18 hours. When a reaction is completed, the solution is cooled to room temperature and added with 100 mL of water. The resulting mixture is filtered and washed three times with 25 mL of dichloroethane, and then dried with anhydrous magnesium sulfate. The obtained product is further purified using a silica gel column to obtain an intermediate product H096-1.

In a 250 mL round bottom flask, 15 mmol of H096-1 and 40 mmol of potassium acetate are mixed with 60 mL of dry 1,4-dioxane, 0.4 mmol of $Pd(PPh3)_2Cl_2$, and 25 mmol of bis(pinacolato)diborane under stirring in a nitrogen atmosphere at 90° C. for 48 hours to obtain an intermediate. The intermediate is cooled to room temperature, added into water, filtered through a pad of celite while being extracted with dichloromethane, washed with water, and dried using anhydrous magnesium sulfate. After filtration and evaporation, a crude product is purified by silica gel column chromatography to obtain an intermediate product H096-2.

In a 250 mL round bottom flask, 10 mmol of intermediate H096-2, 12 mmol of 4-bromo-triphenylamine, 76 mmol of $K_2CO_3$, and 20 mL of dimethylimine sulfone are mixed and refluxed under stirring in a nitrogen atmosphere at 150° C. for 12 hours. When a reaction is completed, the solution is cooled to room temperature and added with 100 mL of water. The resulting mixture is filtered and washed for three times with 25 mL of dichloroethane, and then dried with anhydrous magnesium sulfate. The obtained product is further purified using a silica gel column to obtain the product H096.

Elemental analyses for the compound H096 (molecular formula: $C_{55}H_{37}N_5O$) are as follows. Theoretical molecular weight of H096 is 783.91, including 84.27% of C, 4.76% of H, 8.93% of N, and 2.04% of O.

The exemplary compounds H002, H009, H020, H094, and H096 are simulated using Gaussian software. The simulation results are shown in Table 1.

TABLE 1

| Energy levels of exemplary compounds | | | | |
| --- | --- | --- | --- | --- |
| Compound | HOMO (eV) | LUMO (eV) | $E_g$ (eV) | $E_T$ (eV) |
| H002 | −5.660 | −2.638 | 3.066 | 2.475 |
| H009 | −5.608 | −2.616 | 3.102 | 2.402 |
| H020 | −5.643 | −2.687 | 3.054 | 2.446 |
| H094 | −5.696 | −2.602 | 3.089 | 2.469 |
| H096 | −5.632 | −2.650 | 3.038 | 2.437 | where $E_g$ represents an absolute value of difference between HOMO and LUMO, and $E_T$ represents a triplet value.

It can be seen from Table 1 that, as host materials, H002, H009, H020, H094, and H096 have suitable HOMO and LUMO energy levels and good triplet energy levels ($E_T$>2.20 eV). They are suitable for red light ($E_T$>2.2 eV) and can effectively realize energy transfer between host materials and guest materials without the risk of charge return.

Exemplary Embodiment 6

One embodiment provides an organic light-emitting device. As shown in FIG. 1, the organic light-emitting device includes a glass substrate 1, an ITO anode 2, a first hole transport layer 3, a second hole transport layer 4, a light-emitting layer 5, a first electron transport layer 6, a second electron transport layer 7, a cathode 8 (magnesium-silver electrode with a Mg—Ag mass ratio of 9:1), and a capping layer (CPL) 9, where a thickness of the ITO anode 2 is 15 nm, a thickness of the first hole transport layer 3 is 10 nm, a thickness of the second hole transport layer 4 is 95 nm, a thickness of the light-emitting layer 5 is 30 nm, a thickness of the first electron transport layer 6 is 30 nm, a thickness of the second electron transport layer 7 is 5 nm, a thickness of the cathode 8 is 15 nm, and a thickness of the CPL 10 is 100 nm.

In one embodiment, forming the organic light-emitting device includes:

1) cutting a glass substrate 1 having an ITO anode 2 into a size of 50 mm×50 mm×0.7 mm; ultrasonically treating the substrate in isopropyl alcohol and deionized water, respectively, for 30 minutes; exposing the substrate to ozone for approximately 10 minutes to clean the substrate; and mounting the substrate having the ITO anode 2 on a vacuum deposition equipment;

2) on the ITO anode 2, depositing a hole injection material HAT-CN (molecular structure is shown below) by a vacuum evaporation method to form a layer with a thickness of 10 nm, and this layer is used as the first hole transport layer 3;

3) on the first hole transport layer 3, depositing a second hole injection material TAPC (molecular structure is shown below) by vacuum evaporation to form a layer with a thickness of 95 nm, and this layer is used as the second hole transport layer 4;

4) on the second hole transport layer 4, depositing the compound H002 as a host material and Ir(ppy)$_3$ (molecular structure is shown below) as a doping material at a H002/Ir(ppy)$_3$ mass ratio of 19:1 to form a layer with a thickness of 30 nm, and this layer is used as the light-emitting layer 5;

5) on the light-emitting layer 5, depositing the first electron transport layer 6 having BPen (molecular structure is shown below) with a thickness of 30 nm;

6) on the first electron layer 6, depositing Alq3 (molecular structure is shown below) by vacuum evaporation to form the second electron transport layer 7 with a thickness of 5 nm.

7) on the second electron transport layer 7, depositing magnesium and silver by vacuum evaporation to form the cathode 8 with a thickness of 15 nm, where the mass ratio of Mg—Ag is 9:1; and 8) on the cathode 8, depositing high-refractive hole-type material CBP (molecular structure is shown below) by vacuum evaporation to form the capping layer 9 with a thickness of 100 nm.

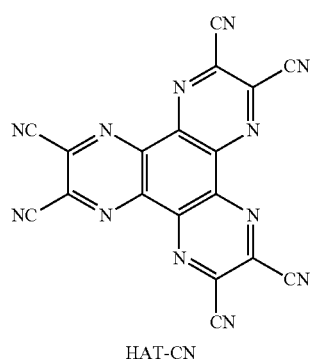

HAT-CN

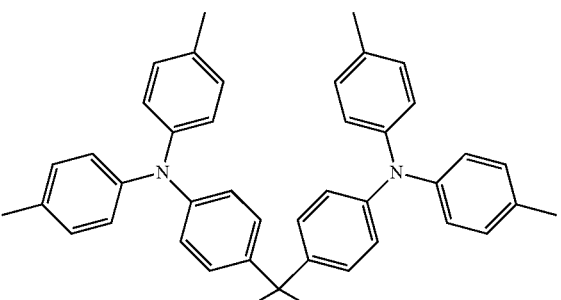

TAPC

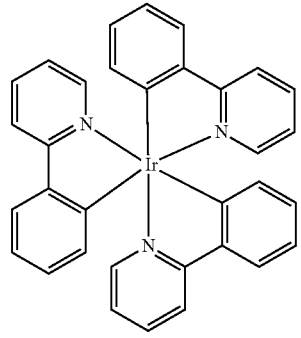

Ir(pyy)3

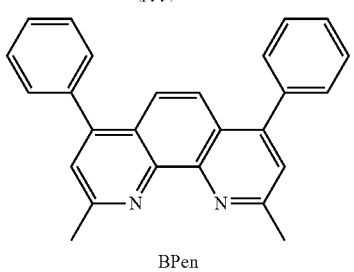

BPen

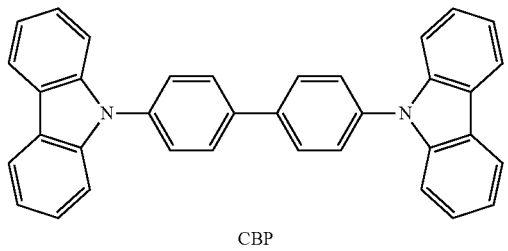

CBP

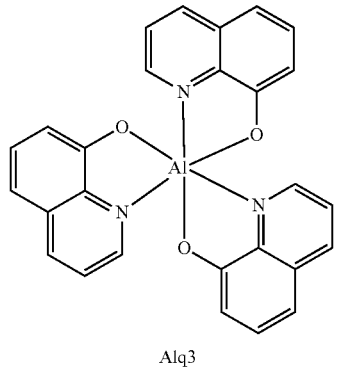

Alq3

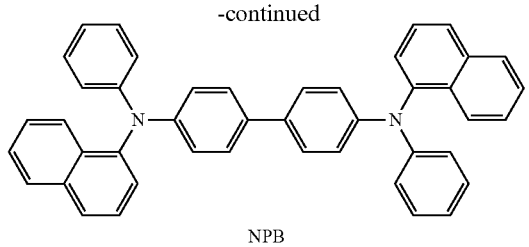

NPB

Exemplary Embodiment 7

Compared with exemplary embodiment 6, forming a device in exemplary device embodiment 7 is the same except that the host material is H009 instead of H002.

Exemplary Embodiment 8

Compared with exemplary embodiment 6, forming a device in exemplary device embodiment 8 is the same except that the host material is H020 instead of H002.

Exemplary Embodiment 9

Compared with exemplary embodiment 6, forming a device in exemplary device embodiment 9 is the same except that the host material is H094 instead of H002.

Exemplary Embodiment 10

Compared with exemplary embodiment 6, forming a device in exemplary device embodiment 10 is the same except that the host material is H096 instead of H002.

Comparative Embodiment 1

Compared with exemplary embodiment 6, forming a device in comparative embodiment 1 is the same except that the host material is NPB instead of H002.

TABLE 2

Device performance characterization

| Number | Host material | Driving voltage (V) | Current efficiency (cd/A) | Lifetime $LT_{95}$ (hrs) (@50 mA/cm$^2$) |
|---|---|---|---|---|
| Embodiment 6 | H002 | 3.80 | 45.1 | 127 |
| Embodiment 7 | H009 | 3.82 | 44.7 | 133 |
| Embodiment 8 | H020 | 3.79 | 43.8 | 121 |
| Embodiment 9 | H094 | 3.86 | 42.9 | 118 |
| Embodiment 10 | H096 | 3.91 | 43.2 | 115 |
| Comparative embodiment 1 | NPB | 3.98 | 40.5 | 110 |

As can be seen from Table 2, compared with the device of the comparative embodiment, the devices with compounds of the present disclosure have lower driving voltages, which are reduced by approximately 2.5%-5.0%, effectively reducing the power consumption of devices. The devices with compounds according to the present disclosure have enhanced luminous efficiencies, which are increased by approximately 7%-13%, improved luminous brightness, and elongated lifetime.

As disclosed, the technical solutions of the present disclosure have the following advantages. For the compound having oxanthracene as a central skeleton according to the present disclosure, when it is used as a host material of an electroluminescent device, it has a high triplet energy level $E_T$, large molecular density, high glass transition temperature, and good thermal stability. It is easy to form a good amorphous film and reduces the driving voltage of a device. In addition, the compound can effectively improve carriers' balanced migration, widen an exciton recombination region, effectively improve light extraction efficiency, and greatly enhance the light-emitting efficiency and lifespan of a device.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A compound having a formula (I):

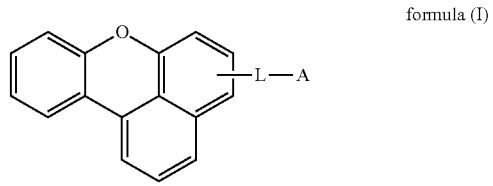

formula (I)

wherein:

A is at least one selected from:

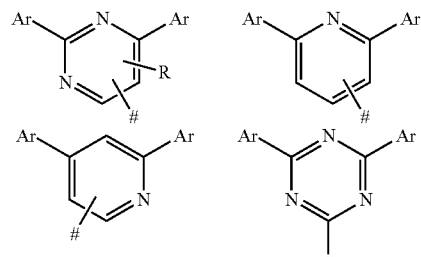

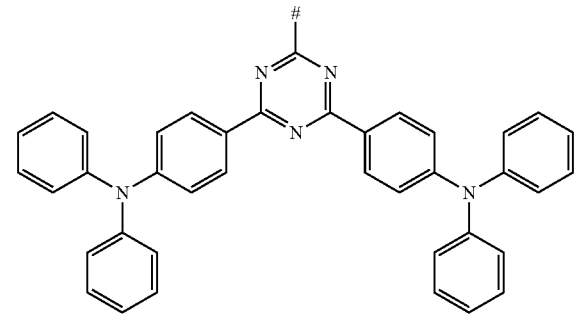

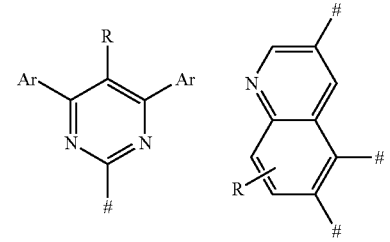

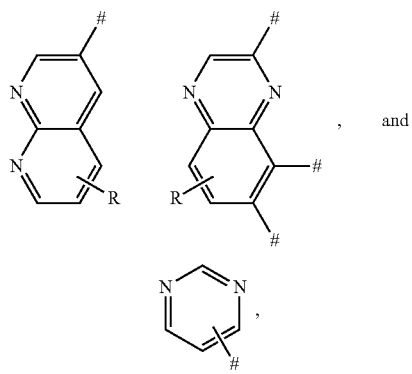

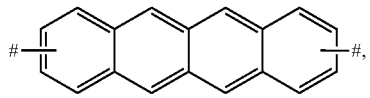

wherein Y is selected from carbon atom, nitrogen atom, oxygen atom, sulfur atom, and silicon atom, and each # independently represents a connection position.

2. The compound according to claim 1, wherein L is one or more selected from:

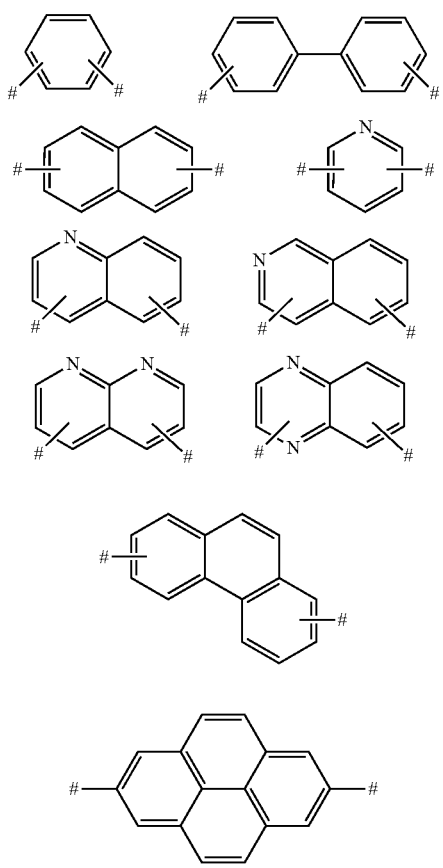

wherein each # independently represents a connection position.

3. The compound according to claim 1, wherein the compound is selected from:

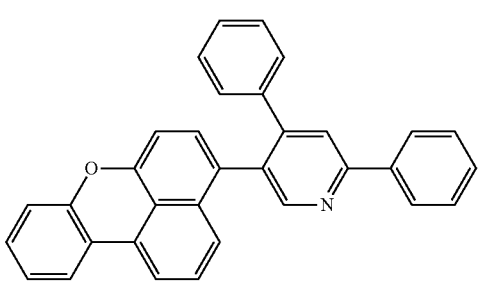

wherein each Ar is independently selected from substituted or unsubstituted phenyl, naphthyl, biphenyl, anthracenyl, and phenanthryl, and the substituent is one or more selected from C1-C6 alkyl and halogen; each R is independently selected from hydrogen atom and C1-C6 alkyl C1-C8 alkoxy, C3-C8 cycloalkyl, C6-C40 aryl, C4-C40 heteroaryl, and C7-C12 alkyl; and each # independently represents a connection position; and L is one or more selected from a single bond,

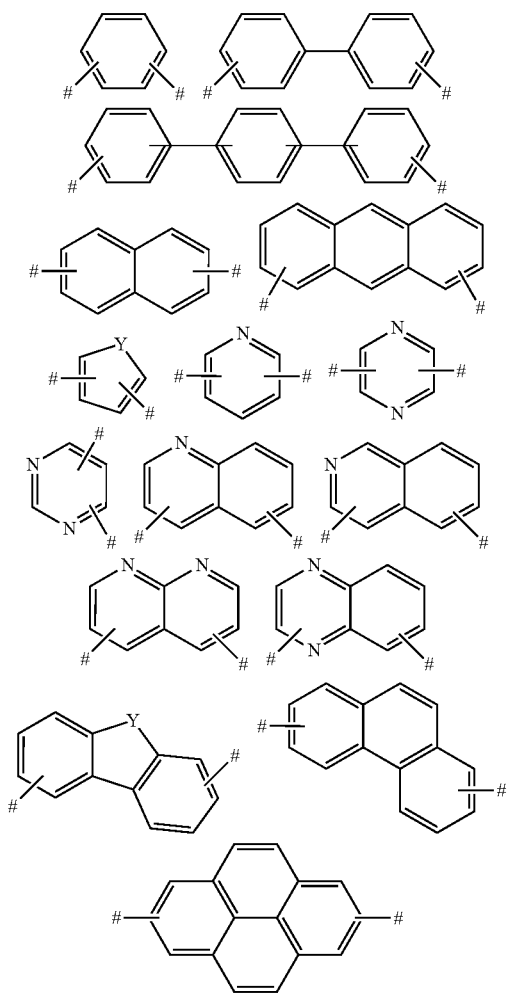

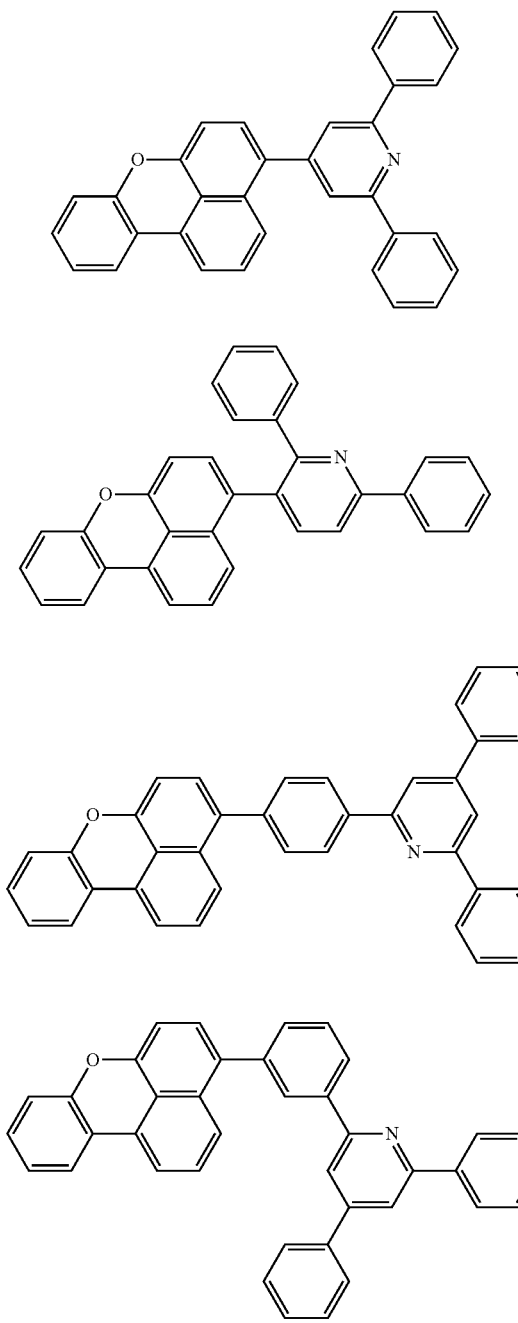
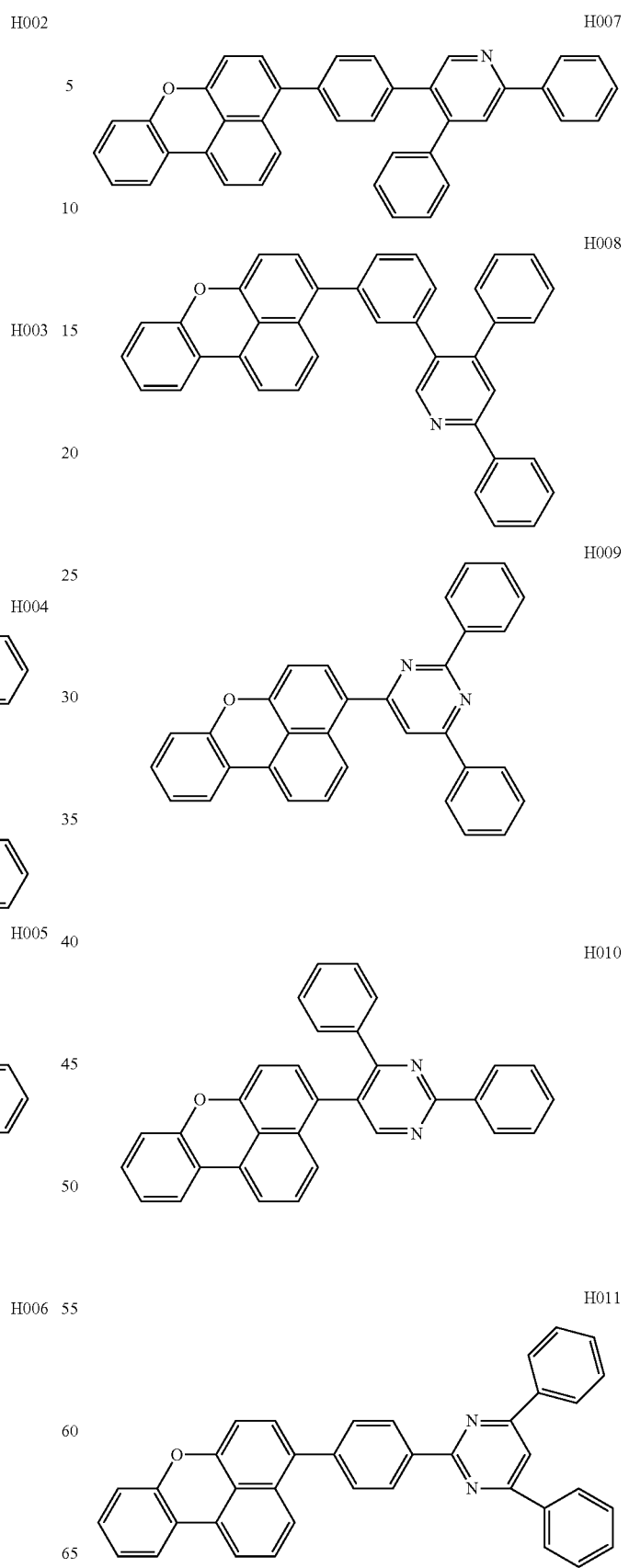

H012
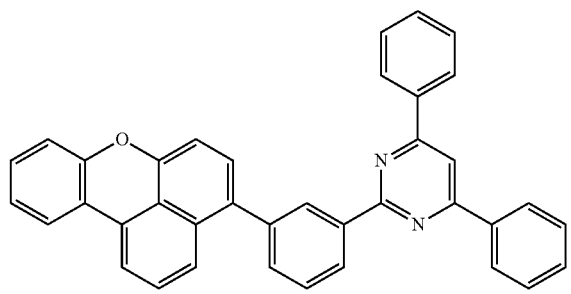
H013
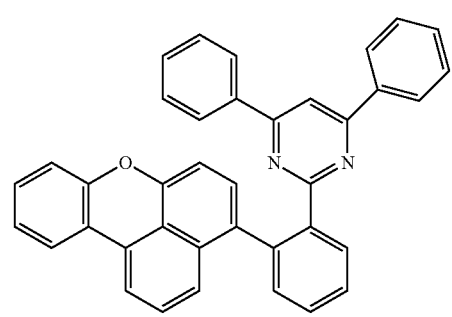
H014
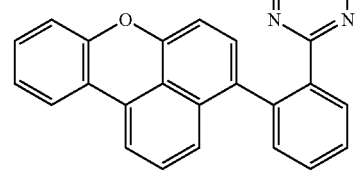
H015
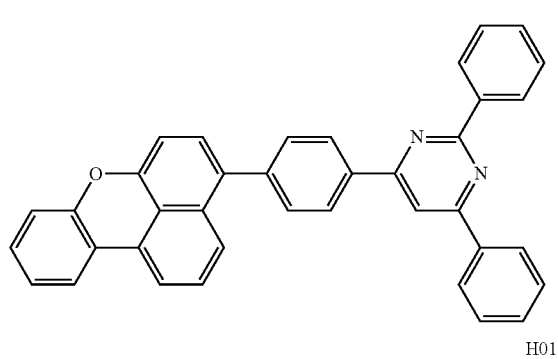
H016
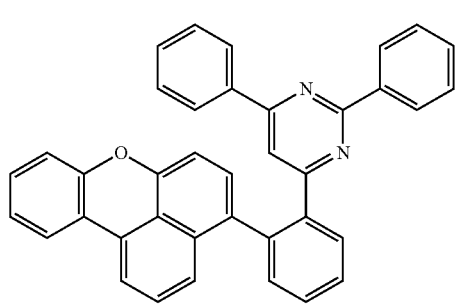
H017
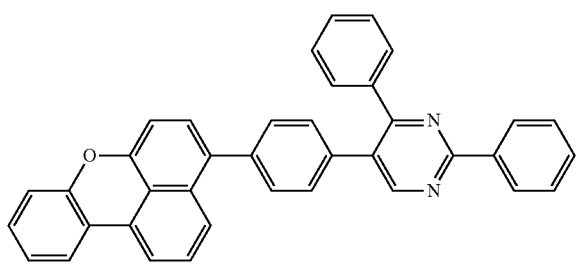
H018
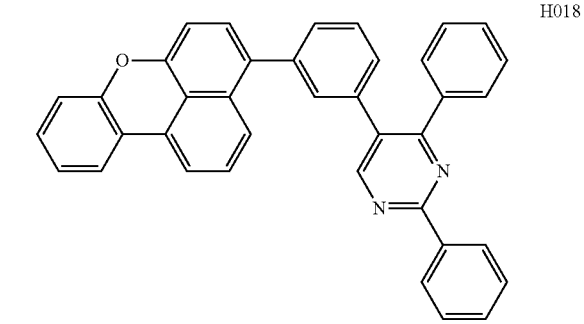
H019
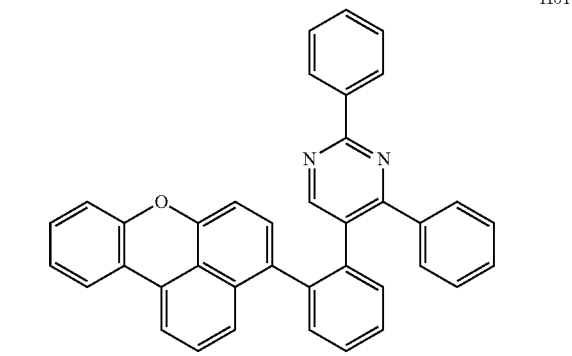
H020
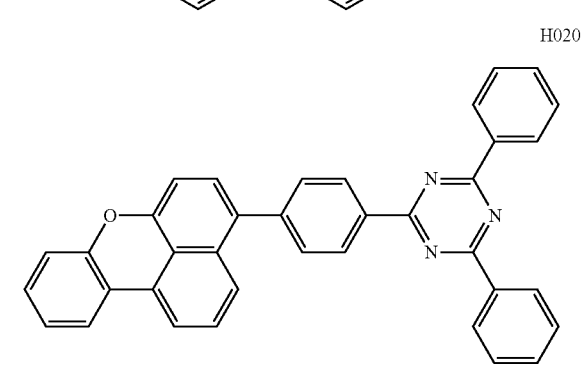
H021
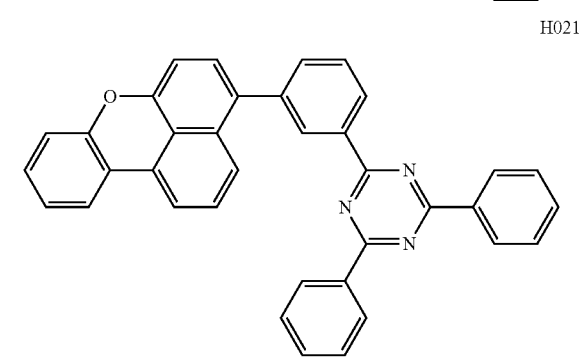

H022
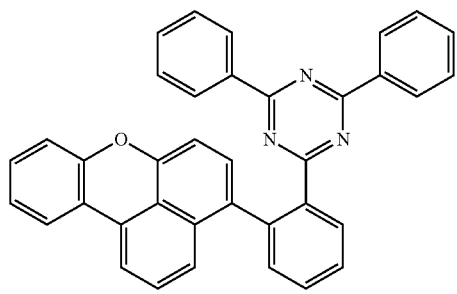
H023
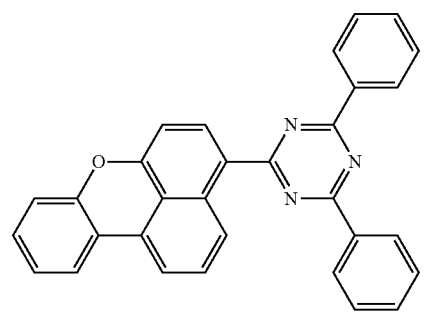
H024
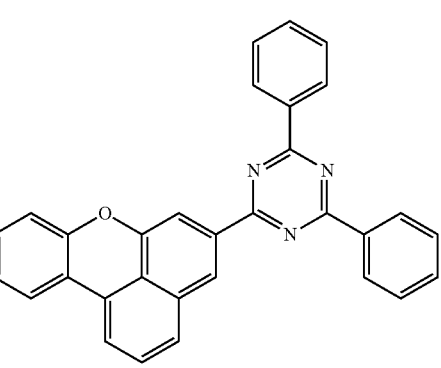
H025
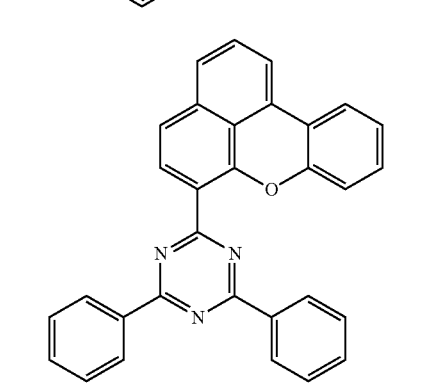
H026
H027
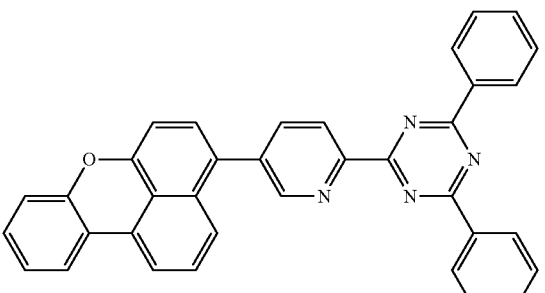
H028
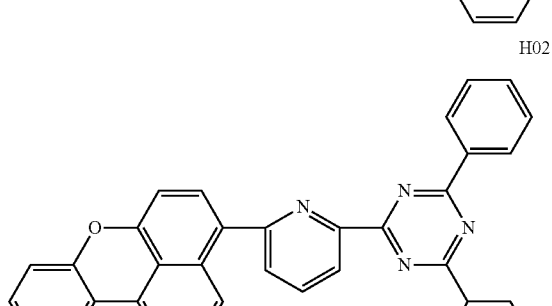
H029
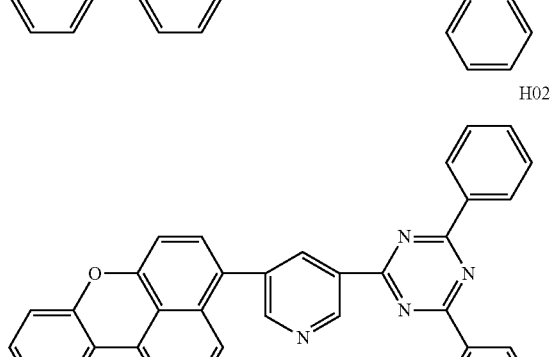
H030
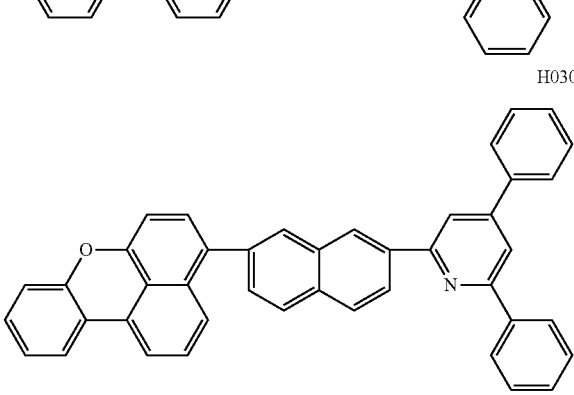
H031

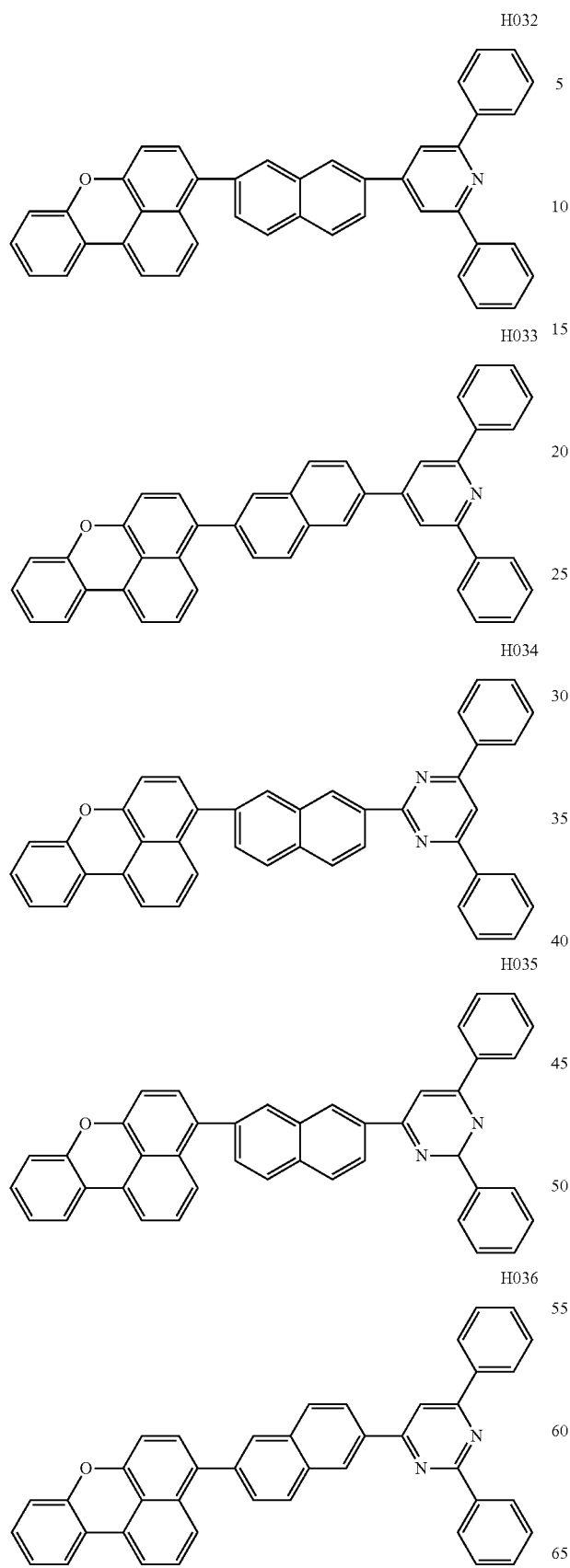
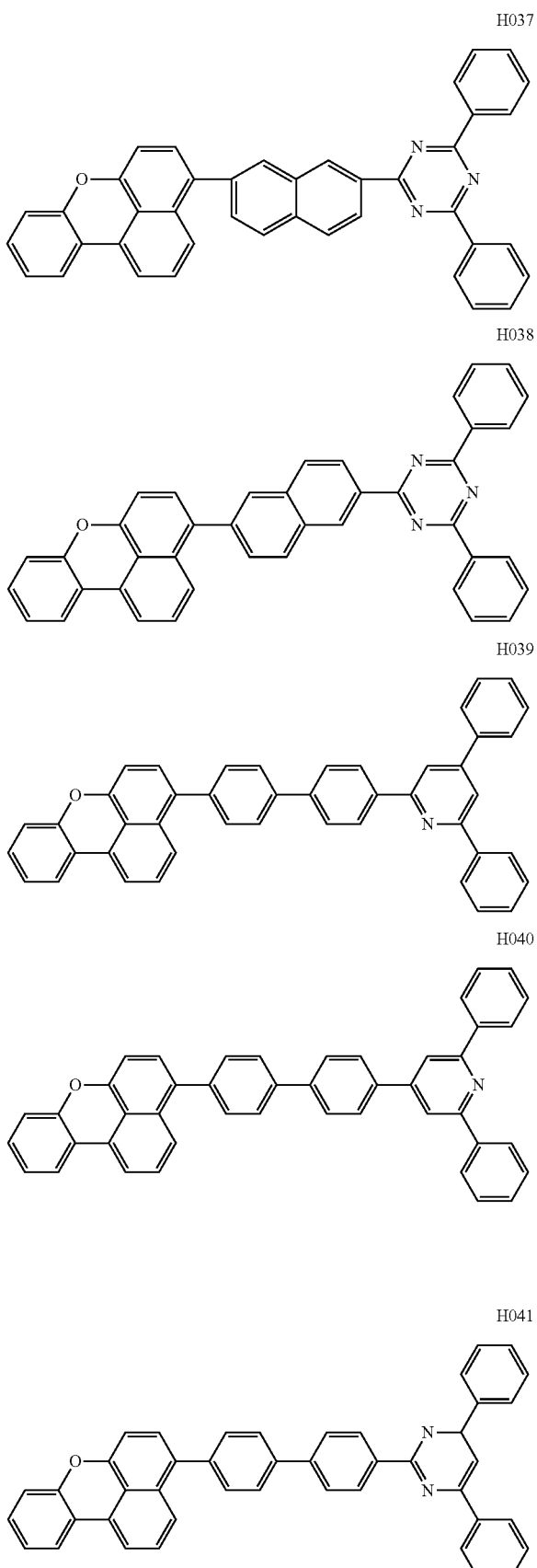

H042
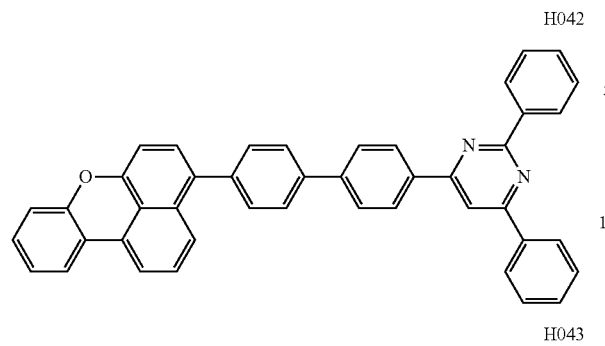
H043
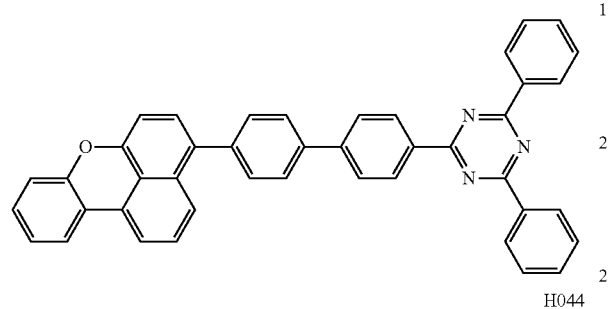
H044
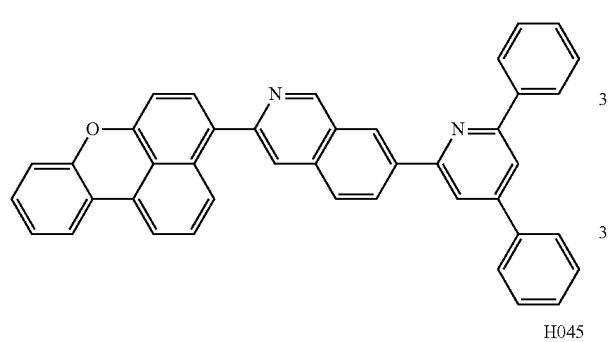
H045
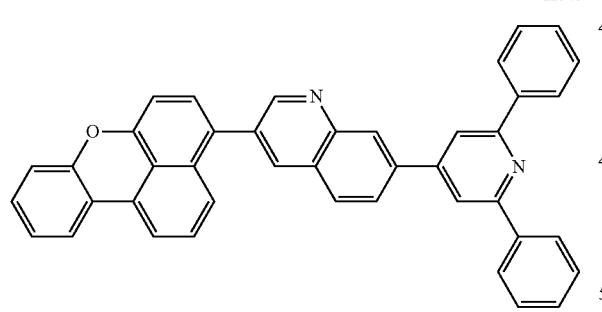
H046
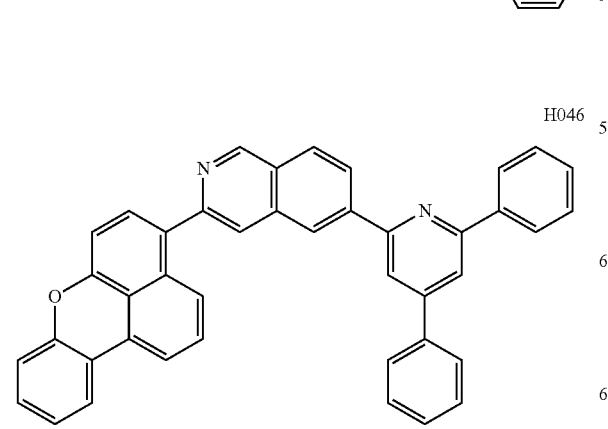
H047
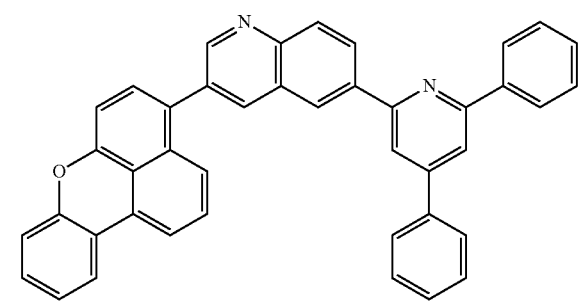
H048
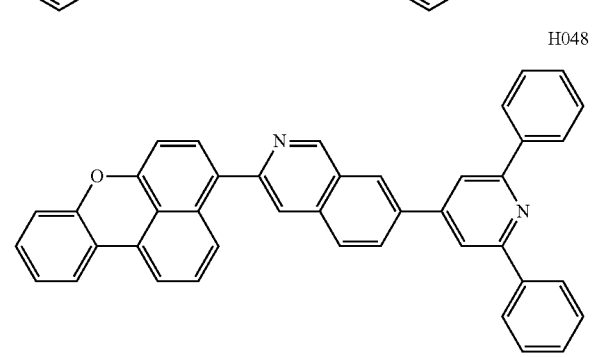
H049
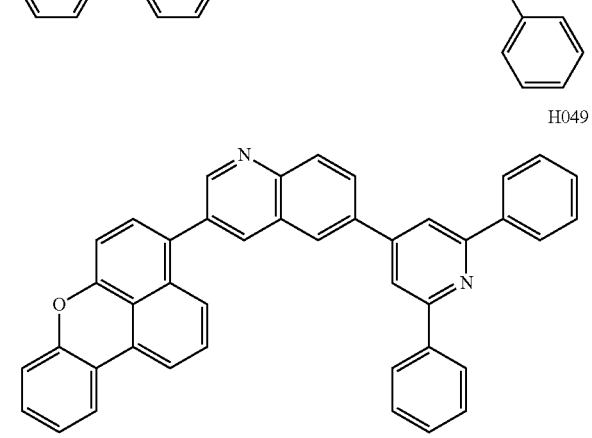
H050
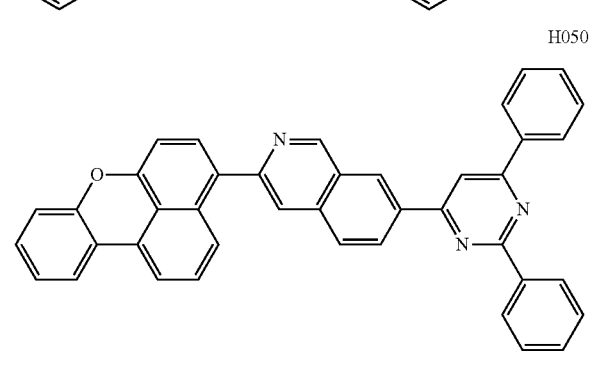
H051
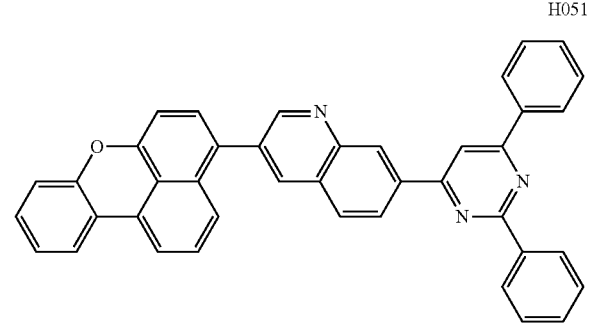

H052
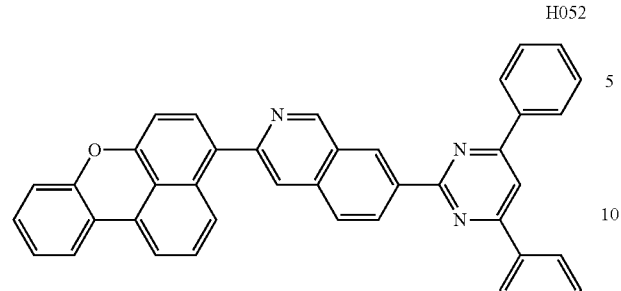
H053
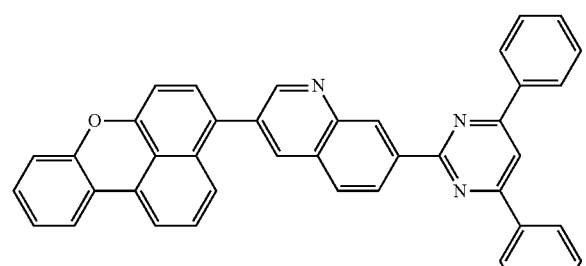
H054
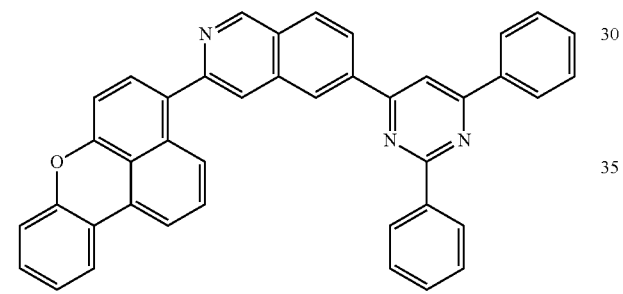
H055
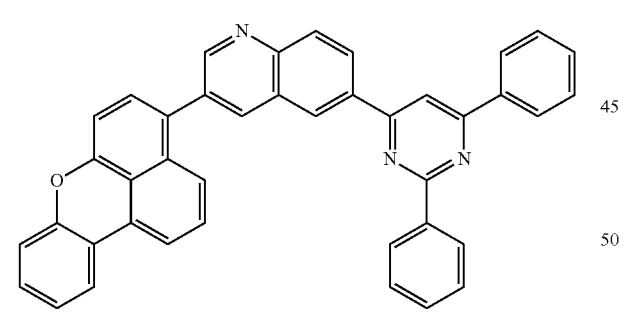
H056
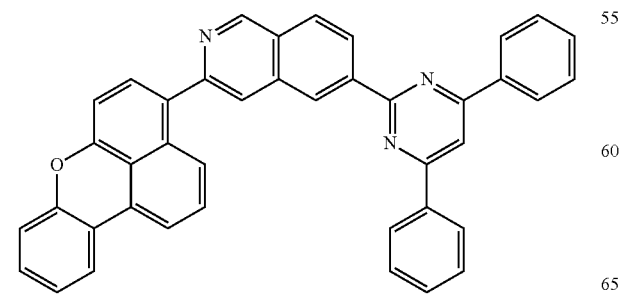
H057
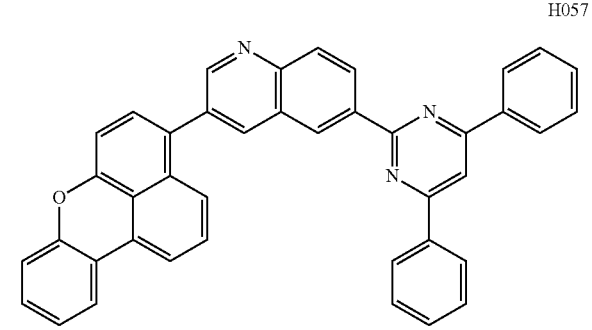
H058
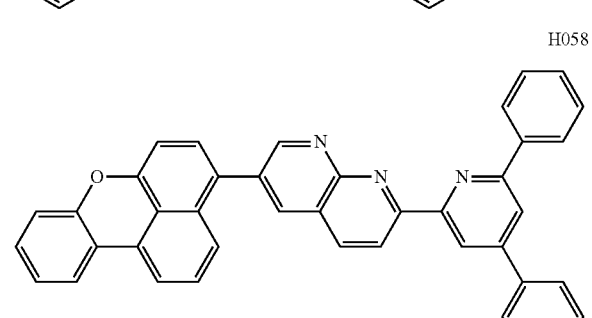
H059
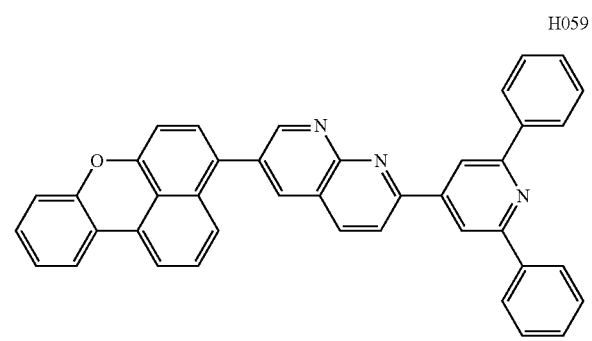
H060
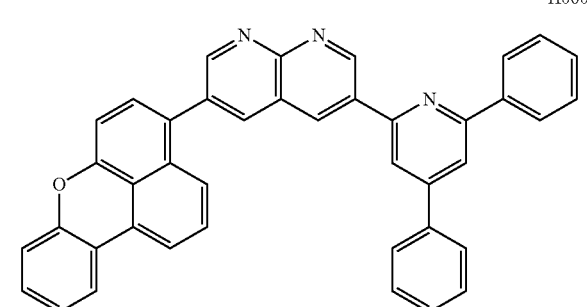
H061
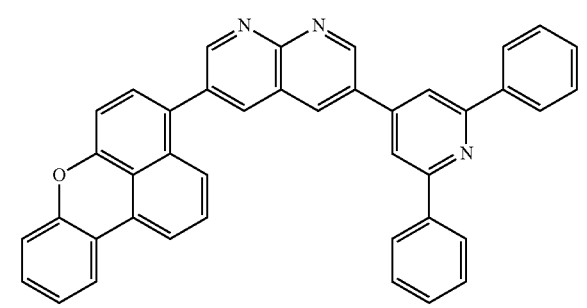

-continued
H062
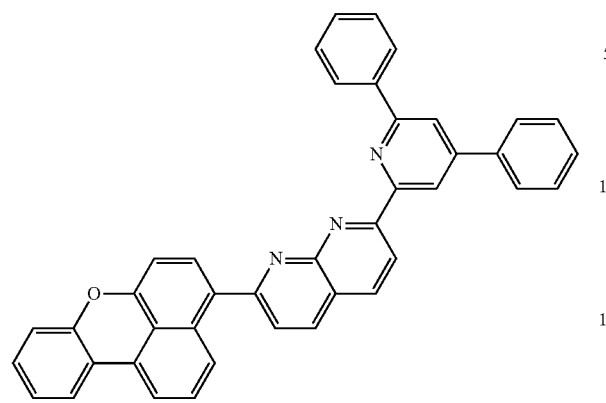
H063
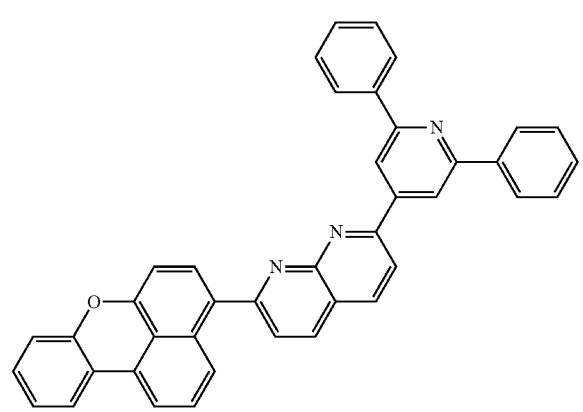
H064
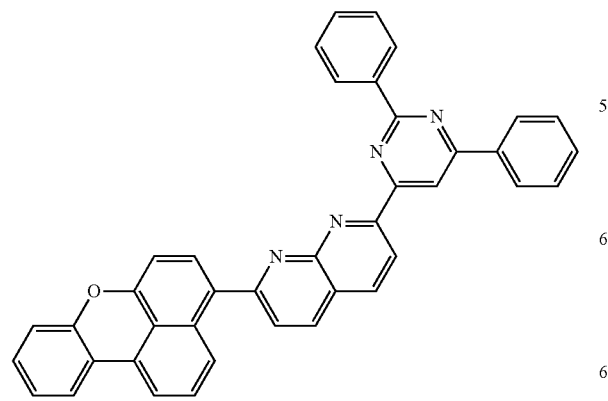
H065
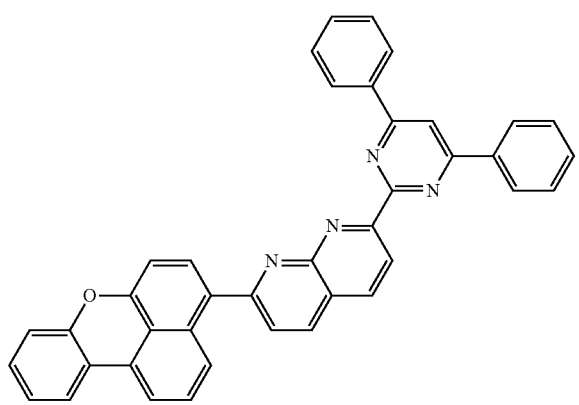
H066
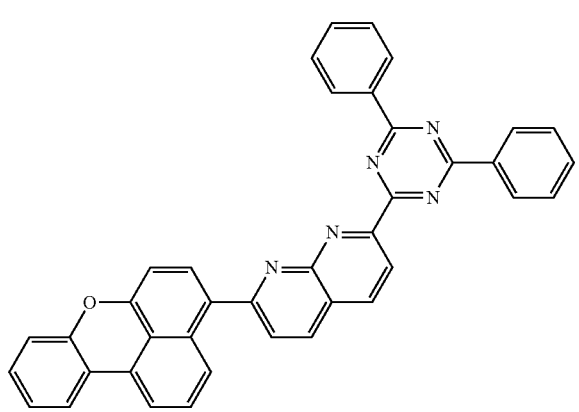
H067
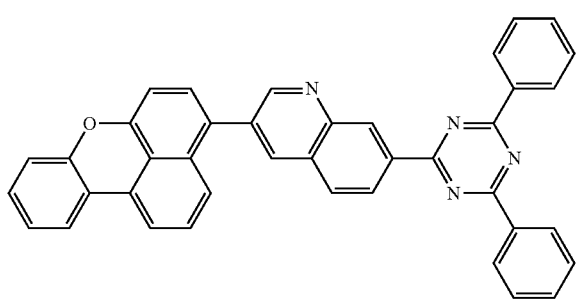
H068
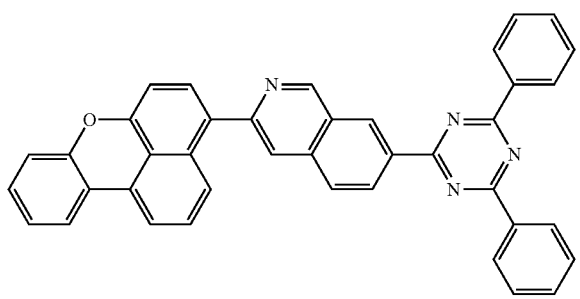

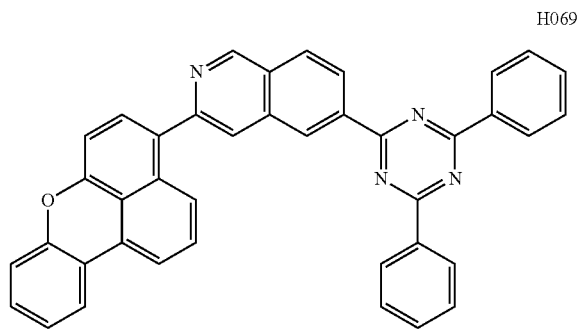 H069
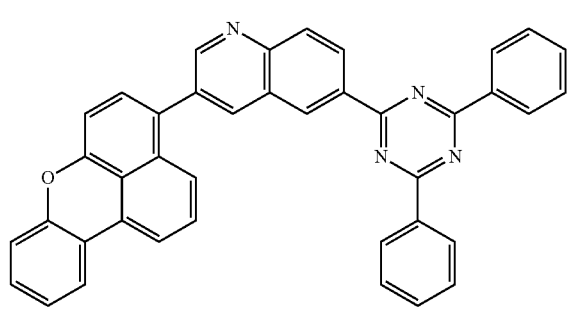 H070
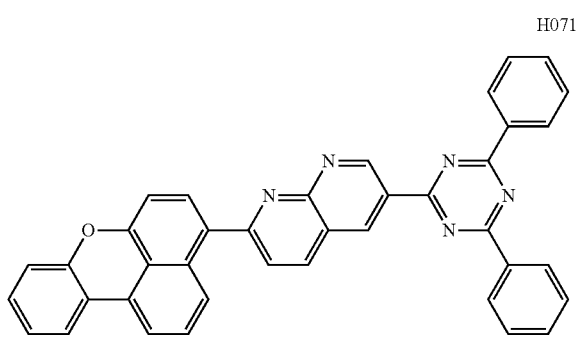 H071
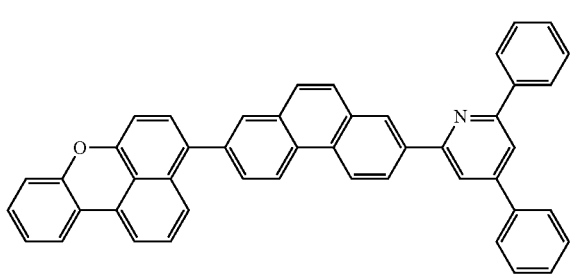 H072
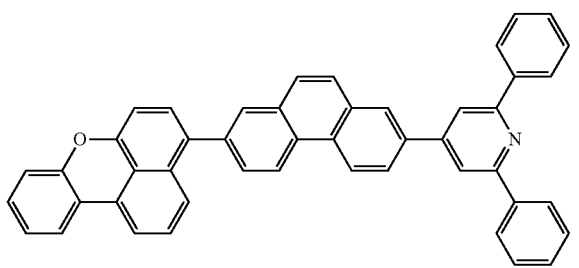 H073
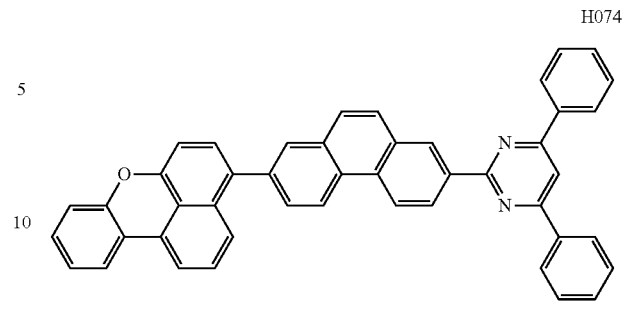 H074
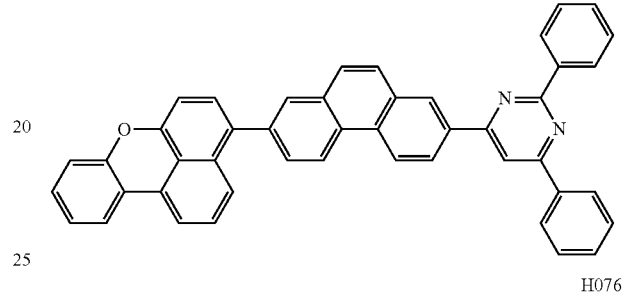 H075
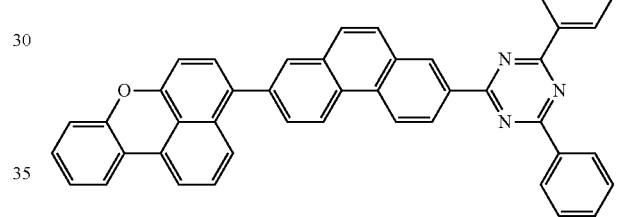 H076
 H077
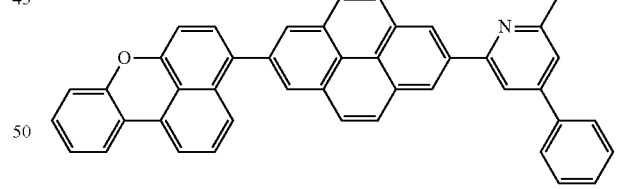 H078

H079
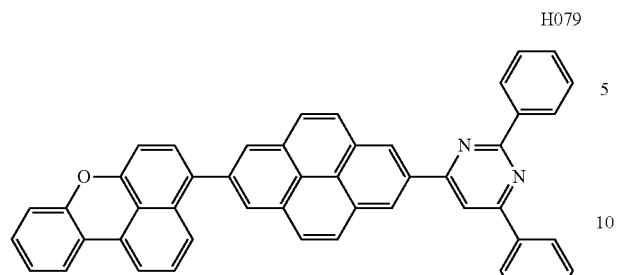
H080
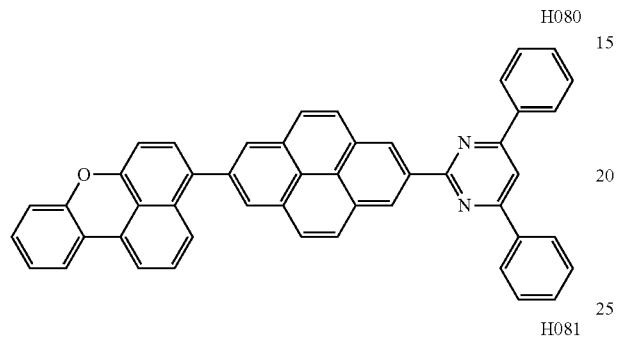
H081
H082
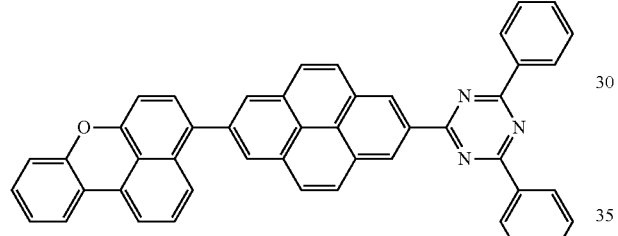
H083
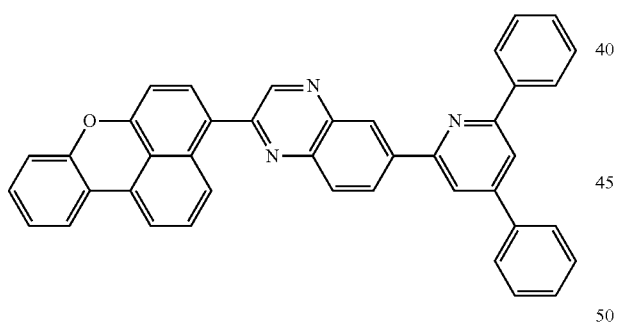
H084
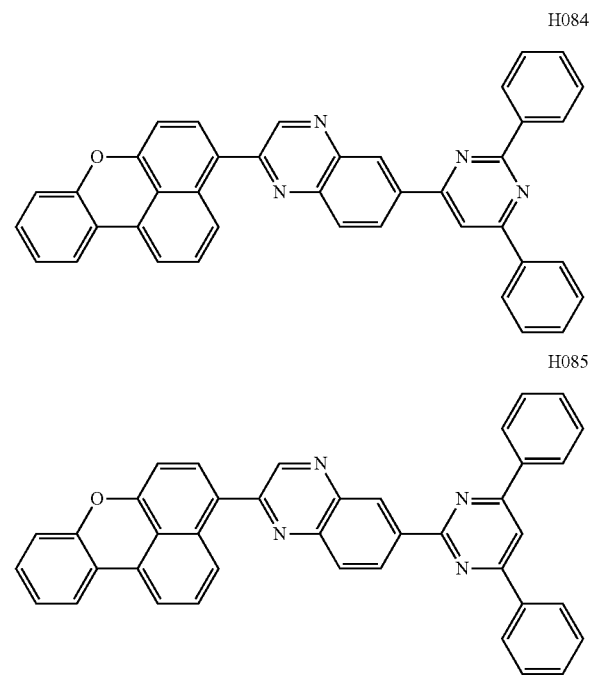
H085
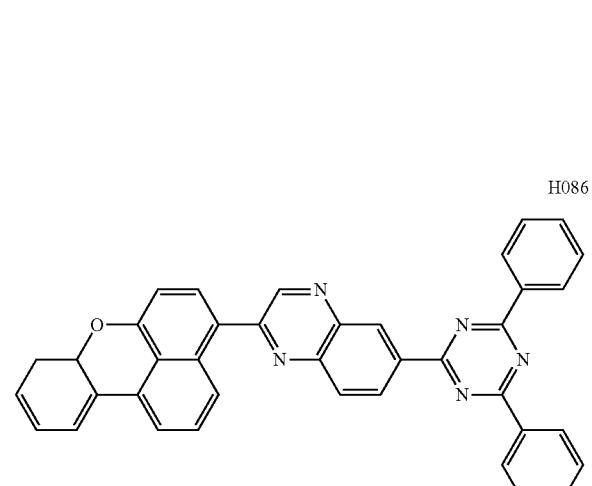
H086
H087

H088
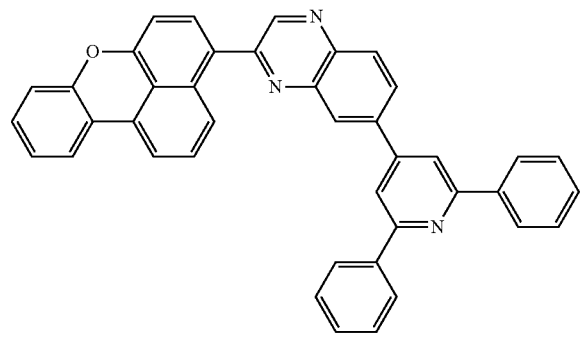
H089
H090
H091
H092
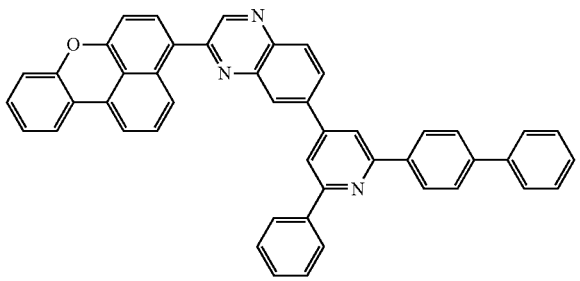
H093
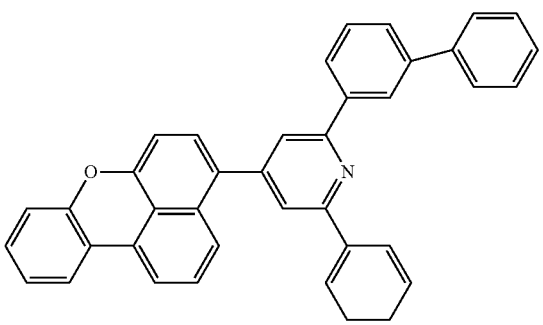
H094
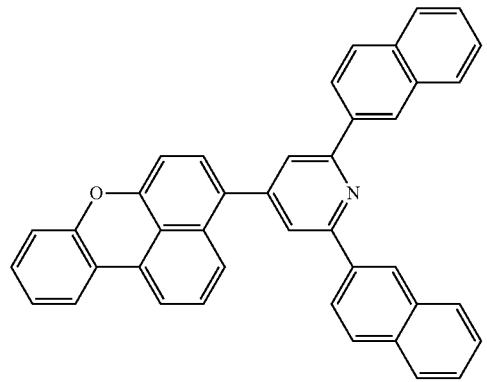
H095
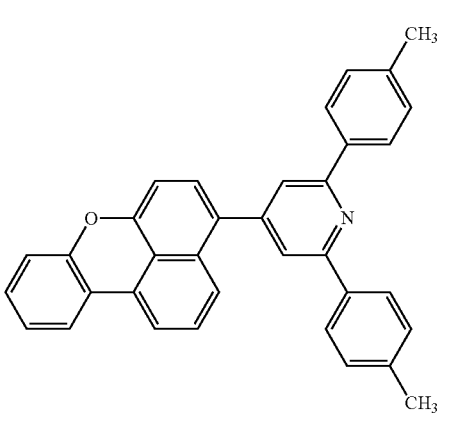
and -continued

H096

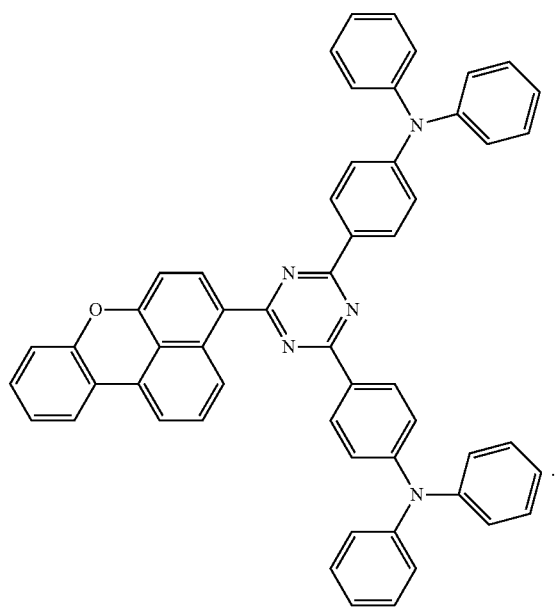

4. The compound according to claim 3, wherein the compound is any one selected from H002, H009, H020, H094, and H096.

5. A display panel, comprising:
an organic light-emitting device, wherein the organic light-emitting device comprises an anode, a cathode, and a light-emitting layer located between the anode and the cathode,
wherein the light-emitting layer is made of a host material including the compound having a formula (I):

formula (I)

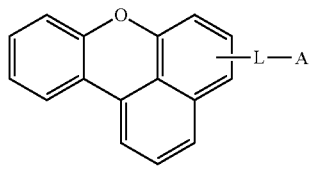

wherein:
A is at least one selected from:

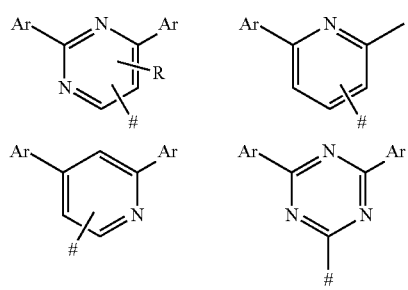

-continued

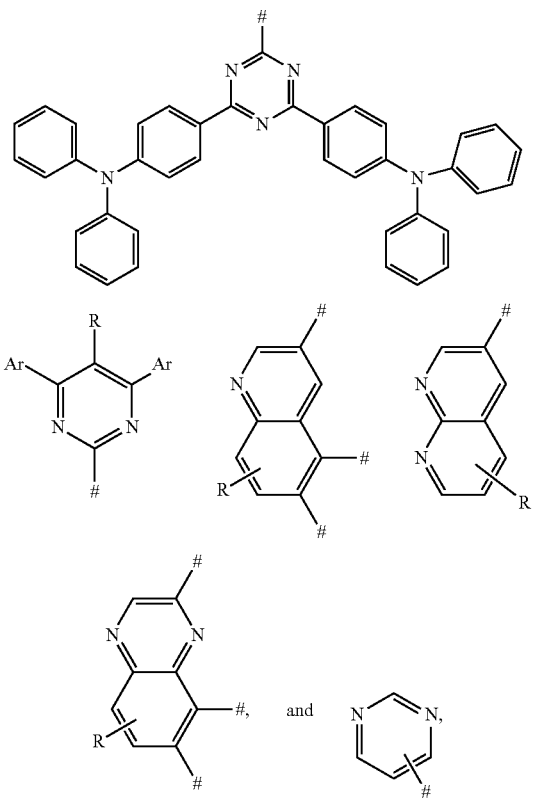

wherein each Ar is independently selected from substituted or unsubstituted phenyl, naphthyl, biphenyl, anthracenyl, and phenanthryl, and the substituent is one or more selected from C1-C6 alkyl and halogen; each R is independently selected from hydrogen atom and C1-C6 alkyl C1-C8 alkoxy, C3-C8 cycloalkyl, C6-C40 aryl, C4-C40 heteroaryl, and C7-C12 alkyl; and each # independently represents a connection position; and L is one or more selected from a single bond,

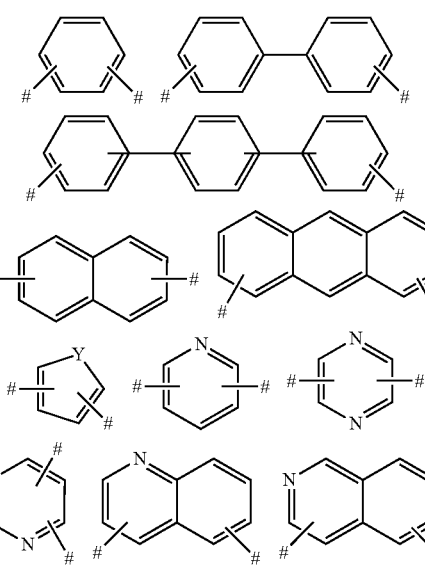

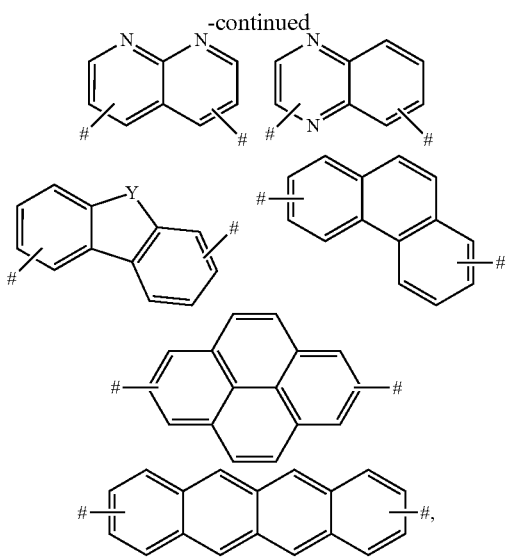

wherein Y is selected from carbon atom, nitrogen atom, oxygen atom, sulfur atom, and silicon atom, and each # independently represents a connection position.

6. The display panel according to claim 5, wherein the host material has a singlet energy level S1 higher than the singlet energy level S1 of a guest material, and a difference between singlet energy level S1 of the host material and singlet energy level S1 of the guest material is less than 0.8 eV; the host material has a triplet energy level T1 higher than the triplet energy level T1 of a guest material, and a difference between triplet energy level T1 of the host material and triplet energy level T1 of the guest material is less than 0.4 eV.

7. The display panel according to claim 5, wherein the host material of the organic light-emitting layer is a red light-emitting material, and the red light-emitting material has a lowest triplet energy level T1 of 2.2 eV.

8. The display panel according to claim 5, wherein the host material of the organic light-emitting layer is a green light-emitting material, and the green light-emitting material has a lowest triplet energy level T1 of 2.5 eV.

9. The display panel according to claim 5, wherein the host material of the light-emitting layer is a blue light-emitting material, and the blue light-emitting material has a lowest triplet energy level T1 of 2.7 eV.

10. The display panel according to claim 5, wherein the organic light-emitting device includes one or more of a capping layer, a first hole transport layer, a second hole transport layer, a first electron transport layer, and a second electron transport layer.

11. The display panel according to claim 10, wherein at least one of the capping layer, the first hole transport layer, the second hole transport layer, the first electron transport layer, and the second electron transport layer include the compound having the formula (I):

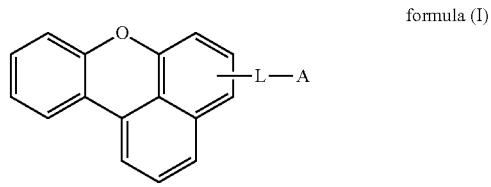

formula (I)

12. A display device, comprising:

a display panel, comprising:

an organic light-emitting device, wherein the organic light-emitting device comprises an anode, a cathode, and a light-emitting layer located between the anode and the cathode, wherein the light-emitting layer is made of a host material including the compound having a formula (I):

formula (I)

wherein:

A is at least one selected from:

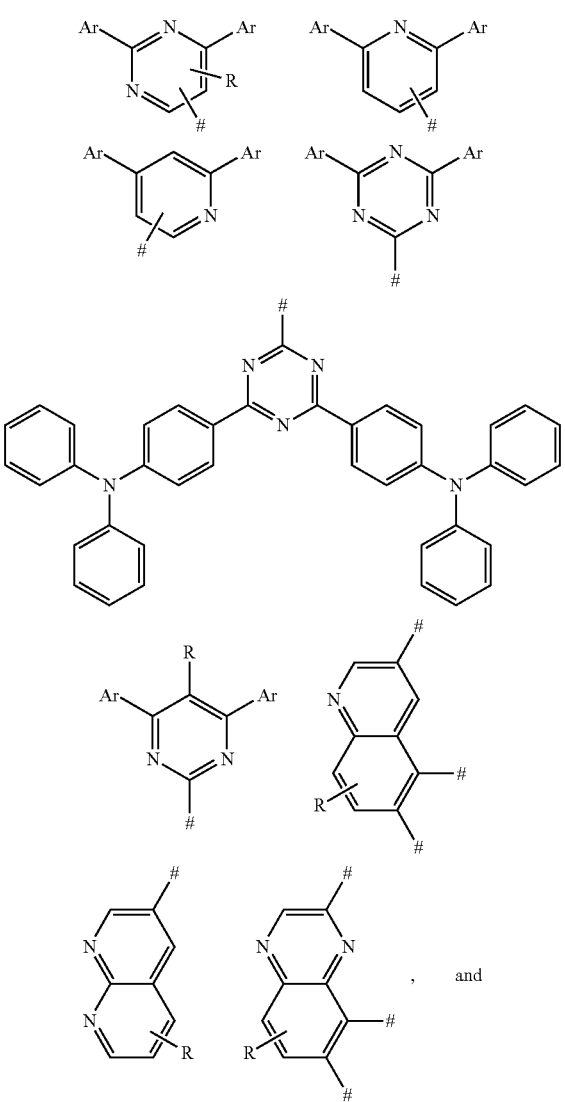

-continued

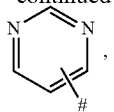, wherein each Ar is independently selected from substituted or unsubstituted phenyl, naphthyl, biphenyl, anthracenyl, and phenanthryl, and the substituent is one or more selected from C1-C6 alkyl and halogen; each R is independently selected from hydrogen atom and C1-C6 alkyl C1-C8 alkoxy, C3-C8 cycloalkyl, C6-C40 aryl, C4-C40 heteroaryl, and C7-C12 alkyl; and each # independently represents a connection position; and L is one or more selected from a single bond,

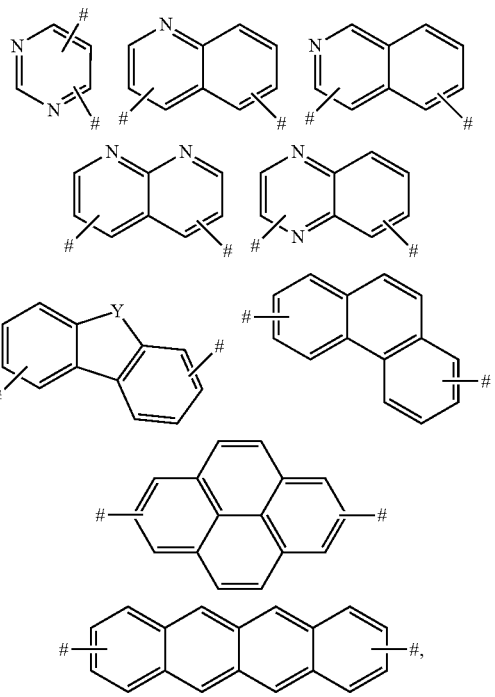

wherein Y is selected from carbon atom, nitrogen atom, oxygen atom, sulfur atom, and silicon atom, and each # independently represents a connection position.

* * * * *